US012615885B2

(12) United States Patent
Inoue et al.

(10) Patent No.: US 12,615,885 B2
(45) Date of Patent: Apr. 28, 2026

(54) NITRIDE-BASED SEMICONDUCTOR LIGHT-EMITTING ELEMENT AND MANUFACTURING METHOD THEREOF

(71) Applicant: Nuvoton Technology Corporation Japan, Kyoto (JP)

(72) Inventors: Noboru Inoue, Toyama (JP); Shinji Yoshida, Shiga (JP)

(73) Assignee: Nuvoton Technology Corporation Japan, Kyoto (JP)

( * ) Notice: Subject to any disclaimer, the term of this patent is extended or adjusted under 35 U.S.C. 154(b) by 197 days.

(21) Appl. No.: 18/666,964

(22) Filed: May 17, 2024

(65) Prior Publication Data

US 2024/0304752 A1    Sep. 12, 2024

Related U.S. Application Data

(60) Division of application No. 17/219,109, filed on Mar. 31, 2021, now Pat. No. 11,990,561, which is a
(Continued)

(30) Foreign Application Priority Data

Nov. 29, 2018    (JP) ................................. 2018-223483

(51) Int. Cl.
| | |
|---|---|
| *H10H 20/81* | (2025.01) |
| *H01S 5/042* | (2006.01) |

(Continued)

(52) U.S. Cl.
CPC ..... *H10H 20/8215* (2025.01); *H01S 5/04256* (2019.08); *H01S 5/34333* (2013.01);
(Continued)

(58) Field of Classification Search
CPC ............... H10H 20/8215; H10H 20/01; H10H 20/01335; H10H 20/0137; H10H 20/819;
(Continued)

(56) References Cited

U.S. PATENT DOCUMENTS

| | | | |
|---|---|---|---|
| 6,455,877 B1 | 9/2002 | Ogawa et al. | |
| 2002/0158259 A1* | 10/2002 | Ono .................... | H01S 5/32341 257/79 |

(Continued)

FOREIGN PATENT DOCUMENTS

| | | |
|---|---|---|
| JP | 2001-148533 A | 5/2001 |
| JP | 2005-101483 A | 4/2005 |

(Continued)

OTHER PUBLICATIONS

International Search Report and Written Opinion issued on Feb. 4, 2020 in International Application No. PCT/JP2019/044457; with partial English translation.
(Continued)

*Primary Examiner* — Douglas W Owens
(74) *Attorney, Agent, or Firm* — Rimon P.C.

(57) ABSTRACT

A nitride-based semiconductor light-emitting element includes: a substrate that is an example of a n-type nitride-based semiconductor including a group IV n-type impurity; and an n-side electrode in contact with the substrate. The substrate includes: a surface layer region in contact with the n-side electrode and including a halogen element; and an internal region located across the surface layer region from the n-side electrode. A peak concentration of the group IV n-type impurity in the surface layer region is at least $1.0 \times 10^{21}$ cm$^{-3}$. A peak concentration of the halogen element in the surface layer region is at least 10% of the peak concentration of the group IV n-type impurity in the surface layer region. A concentration of the group IV n-type impu-
(Continued)

rity in the internal region is lower than a concentration of the group IV n-type impurity in the surface layer region.

9 Claims, 17 Drawing Sheets

Related U.S. Application Data continuation of application No. PCT/JP2019/044457, filed on Nov. 13, 2019.

(51) Int. Cl.
| | |
|---|---|
| *H01S 5/343* | (2006.01) |
| *H10H 20/01* | (2025.01) |
| *H10H 20/819* | (2025.01) |
| *H10H 20/825* | (2025.01) |

(52) U.S. Cl.
CPC ....... *H10H 20/01* (2025.01); *H10H 20/01335* (2025.01); *H10H 20/0137* (2025.01); *H10H 20/819* (2025.01); *H10H 20/825* (2025.01)

(58) Field of Classification Search
CPC .. H10H 20/825; H10H 20/032; H10H 20/832; H01S 5/04256; H01S 5/34333; H01S 5/0014; H01S 5/0021; H01S 5/04257; H01S 2301/176; H01S 5/0234; H01S 5/04254; H01S 5/0206; H01S 5/04252; H01S 5/2214; H01S 5/305; H01S 5/2009
See application file for complete search history.

(56) References Cited

U.S. PATENT DOCUMENTS

| | | | |
|---|---|---|---|
| 2004/0161010 | A1 | 8/2004 | Matsumura |
| 2005/0184299 | A1 | 8/2005 | Matsumura et al. |
| 2007/0187666 | A1 | 8/2007 | Watanabe et al. |
| 2015/0076562 | A1 | 3/2015 | Yasui et al. |

FOREIGN PATENT DOCUMENTS

| | | | |
|---|---|---|---|
| JP | 2005-268769 | A | 9/2005 |
| JP | 2005-303278 | A | 10/2005 |
| JP | 2012-79967 | A | 4/2012 |
| JP | 2012-253205 | A | 12/2012 |
| JP | 2013-258259 | A | 12/2013 |

OTHER PUBLICATIONS

Notice of Allowance dated Jan. 18, 2024 issued in U.S. Appl. No. 17/219,109.

* cited by examiner

Group IV n-type impurity + Halogen element

Group IV n-type impurity
+
Halogen element

NITRIDE-BASED SEMICONDUCTOR LIGHT-EMITTING ELEMENT AND MANUFACTURING METHOD THEREOF

CROSS REFERENCE TO RELATED APPLICATIONS

This is a Divisional of U.S. patent application Ser. No. 17/219,109, filed Mar. 31, 2021, now U.S. Pat. No. 11,990, 561, which is a Continuation of International Patent Application No. PCT/JP2019/044457 filed on Nov. 13, 2019, designating the United States of America, which is based on and claims priority of Japanese Patent Application No. 2018-223483 filed on Nov. 29, 2018. The entire disclosures of the above-identified applications, including the specifications, drawings and claims are incorporated herein by reference in their entirety.

FIELD

The present disclosure relates to a nitride-based semiconductor light-emitting element and a manufacturing method thereof.

BACKGROUND

Light-emitting elements formed using gallium nitride (GaN) are conventionally known. For example, Patent Literature (PTL) 1 discloses a semiconductor light-emitting element that achieves favorable ohmic characteristics, by setting an impurity concentration of an n-type semiconductor to be high at a portion contacting with an electrode.

CITATION LIST

Patent Literature

PTL 1: Japanese Unexamined Patent Application Publication No. 2001-148533

SUMMARY

Technical Problem

In recent years, along with miniaturization of chip sizes and higher-power output, an increase in current densities and high-temperature operations have been required. With the above-described conventional semiconductor light-emitting element, however, an element voltage increases in a large-current density operation or a high-temperature operation.

In view of the above, the present disclosure provides a nitride-based semiconductor light-emitting element having stable voltage characteristics in a large-current density operation or a high-temperature operation and a manufacturing method of the nitride-based semiconductor light-emitting element.

Solution to Problem

In order to solve the above-described problem, a nitride-based semiconductor light-emitting element according to an aspect of the present disclosure includes a first n-type nitride-based semiconductor layer including a group IV n-type impurity; and an n-side electrode in contact with the first n-type nitride-based semiconductor layer. In the nitride-based semiconductor light-emitting element, the first n-type nitride-based semiconductor layer includes a surface layer region in contact with the n-side electrode, the surface layer region including a halogen element, and an internal region located across the surface layer region from the n-side electrode. A peak concentration of the group IV n-type impurity in the surface layer region is at least $1.0 \times 10^{21}$ $cm^{-3}$. A peak concentration of the halogen element in the surface layer region is at least 10% of the peak concentration of the group IV n-type impurity in the surface layer region. A concentration of the group IV n-type impurity in the internal region is lower than a concentration of the group IV n-type impurity in the surface layer region.

A manufacturing method of a nitride-based semiconductor light-emitting element according to an aspect of the present disclosure includes dry etching an n-type nitride-based semiconductor layer, using plasma containing a group IV n-type impurity and a halogen element; and forming an n-side electrode on a surface of the n-type nitride-based semiconductor layer, the surface having been exposed to the plasma in the dry etching. In the manufacturing method, a peak concentration of the group IV n-type impurity in a surface layer region, which includes the surface, of the n-type nitride-based semiconductor layer is at least $1.0 \times 10^{21}$ $cm^{-3}$, and a peak concentration of the halogen element in the surface layer region is at least 10% of the peak concentration of the group IV n-type impurity in the surface layer region.

A manufacturing method of a nitride-based semiconductor light-emitting element according to an aspect of the present disclosure includes: dry etching an n-type nitride-based semiconductor layer, using plasma containing a group IV n-type impurity and a halogen element; and forming an n-side electrode on a surface of the n-type nitride-based semiconductor layer, the surface having been exposed to the plasma in the dry etching. In the manufacturing method, the n-type nitride-based semiconductor layer includes Ga, and in an emission spectrum of the plasma at an end time of the dry etching, a peak intensity of a first emission peak resulting from Ga is lower than a peak intensity of a second emission peak resulting from the group IV n-type impurity or the halogen element.

Advantageous Effects

According to the present disclosure, it is possible to provide a nitride-based semiconductor light-emitting element having stable voltage characteristics in a large-current density operation or a high-temperature operation and a manufacturing method of the nitride-based semiconductor light-emitting element.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 16B is a cross-sectional view illustrating dry etching of the semiconductor layers included in the manufacturing method of the light-emitting diode element according to Embodiment 2.

DESCRIPTION OF EMBODIMENTS

Outline of the Present Disclosure

Figure 1:
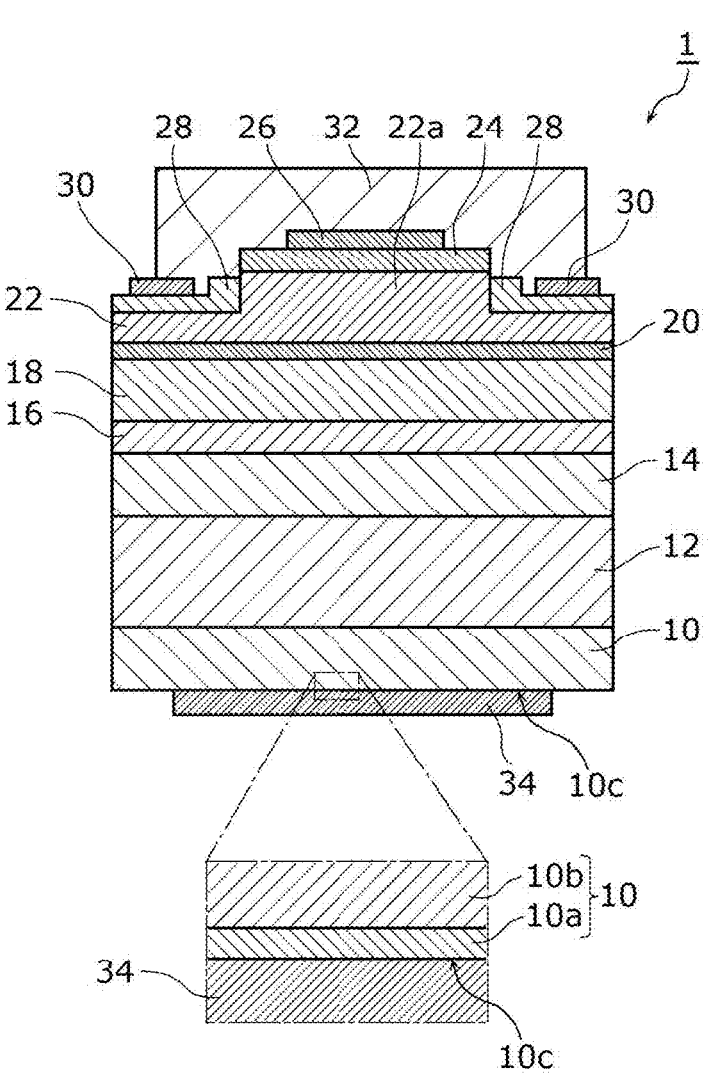
FIG. 1 is a cross-sectional view illustrating a configuration of a semiconductor laser element according to Embodiment 1.

A nitride-based semiconductor light-emitting element according to an aspect of the present disclosure includes a first n-type nitride-based semiconductor layer including a group IV n-type impurity; and an n-side electrode in contact with the first n-type nitride-based semiconductor layer. In the nitride-based semiconductor light-emitting element, the first n-type nitride-based semiconductor layer includes a surface layer region in contact with the n-side electrode, the surface layer region including a halogen element, and an internal region located across the surface layer region from the n-side electrode. A peak concentration of the group IV n-type impurity in the surface layer region is at least $1.0 \times 10^{21}$ cm$^{-3}$. A peak concentration of the halogen element in the surface layer region is at least 10% of the peak concentration of the group IV n-type impurity in the surface layer region. A concentration of the group IV n-type impurity in the internal region is lower than a concentration of the group IV n-type impurity in the surface layer region.

Accordingly, since the peak concentration of the halogen element included in the surface layer region is high, it is possible to inhibit diffusion of the group IV n-type impurity included in the internal region into the n-side electrode. Since the diffusion of the group IV n-type impurity is inhibited, it is possible to inhibit the resistance of the connecting point between the first n-type nitride-based semiconductor layer and the n-side electrode from becoming high, and thus excellent ohmic contact can be realized. As a result, it is possible to implement a nitride-based semiconductor light-emitting element having stable voltage characteristics in a large-current density operation or a high-temperature operation.

For example, in the nitride-based semiconductor light-emitting element according to an aspect of the present disclosure, the surface layer region may have a current density of at least 0.47 kA cm$^{-2}$ in operation.

In the operation of a large-current density of at least 0.47 kAcm$^{-2}$, heat generation of the nitride-based semiconductor light-emitting element increases due to the large current, and diffusion of the group IV n-type impurity included in the internal region into the n-side electrode also increases due to the heat generation. Diffusion of the group IV n-type impurity into the n-side electrode is inhibited by adopting the configuration of the present disclosure to the nitride-based semiconductor light-emitting element. As a result, it is possible to stabilize an operation voltage even in the operation of a large-current density of at least 0.47 kAcm$^{-2}$.

For example, in the nitride-based semiconductor light-emitting element according to an aspect of the present disclosure, an operation temperature may be at least 67 degrees Celsius.

In the operation of a high temperature of at least 67 degrees Celsius, diffusion of the group IV n-type impurity included in the internal region into the n-side electrode also increases. Diffusion of the group IV n-type impurity into the n-side electrode is inhibited by adopting the configuration of the present disclosure to the nitride-based semiconductor light-emitting element. As a result, it is possible to stabilize an operation voltage even in the operation of a high temperature of at least 67 degrees Celsius.

For example, the surface layer region may have a thickness of at least 1 nm and less than 100 nm.

Accordingly, with the thickness of the surface layer region being at least 1 nm, it is possible to sufficiently ensure the thickness of the surface layer region for inhibiting diffusion of the n-type impurity into the n-side electrode. In addition, with the thickness of the surface layer region being less than 100 nm, an increase in defects of the first n-type nitride-based semiconductor layer resulting from a halogen element is inhibited. As a result, it is possible to inhibit degradation of ohmic contact.

For example, the n-side electrode may include: at least one type of metal selected from a group consisting of Ti, Al, Pt, Au, Mo, Sn, In, Ni, Cr, Nb, Ba, Ag, Rh, Ir, Ru, and Hf; or an alloy of at least two types of metal selected from the group.

Accordingly, it is possible to implement excellent ohmic contact between the first n-type nitride-based semiconductor layer and the n-side electrode.

For example, the group IV n-type impurity may be Si.

Si has a small ionic radius compared to Ge or the like. Accordingly, Si can easily enter between crystal lattices, and thus it is possible to add Si to the first n-type nitride-based semiconductor layer at a high concentration. In particular, the surface layer region including Si can be easily formed by dry etching, etc. with high controllability for an impurity concentration. Accordingly, the operation voltage of the nitride-based semiconductor light-emitting element can be reduced. As a result, it is possible to implement the nitride-based semiconductor light-emitting element that is highly reliable and has an excellent voltage characteristics.

For example, the halogen element may be Cl.

Cl has a small ionic radius compared to Br or the like. Accordingly, Cl can easily enter between crystal lattices, and thus it is possible to add Cl to the first n-type nitride-based semiconductor layer at a high concentration. In particular, the surface layer region including Cl can be easily formed by dry etching, etc. with high controllability for an impurity concentration. Accordingly, the voltage increase ratio of the nitride-based semiconductor light-emitting element can be reduced. As a result, it is possible to implement a nitride-based semiconductor light-emitting element having stable voltage characteristics.

For example, the surface layer region may include a surface that is in contact with the n-side electrode, and is a (000-1) plane.

Accordingly, since the nitride-based semiconductor light-emitting element having a vertical structure can be implemented, it is possible to sufficiently ensure an area of a current path according to the n-side electrode area, by implementing a vertical conduction, compared to the case where the n-side electrode is formed on the (0001) plane. As a result, it is possible to reduce the operation voltage of the element.

For example, the nitride-based semiconductor light-emitting element according to an aspect of the present disclosure may further include a principal surface located on a side opposite to the surface layer region relative to the internal region in a laminating direction, and the principal surface may be connected to a submount.

Accordingly, the nitride-based semiconductor light emitting element is connected to the submount on the side close to the light emission region. As a result, it is possible to enhance the heat dissipation property.

For example, the first n-type nitride-based semiconductor layer may be an n-type nitride-based semiconductor substrate.

Accordingly, it is possible to form an n-side electrode having an excellent heat resistance property. As a result, it is possible to implement an excellent ohmic contact that is highly reliable.

For example, the n-type nitride-based semiconductor substrate may have a thickness of at least 50 μm and at most 150 μm.

Accordingly, it is possible to stably form a surface layer region by ensuring a large thickness of the substrate. As a result, it is possible to implement an excellent ohmic contact that is highly reliable.

For example, the nitride-based semiconductor light-emitting element according to an aspect of the present disclosure may further include a second n-type nitride-based semiconductor layer and a p-type nitride-based semiconductor layer laminated in sequence on the n-type nitride-based semiconductor substrate on a side opposite to a side on which the surface layer region is located.

Accordingly, it is possible to stabilize an operation voltage of an element having p-n junction such as a light-emitting diode element, for example.

For example, the nitride-based semiconductor light-emitting element according to an aspect of the present disclosure may further include a substrate. The first n-type nitride-based semiconductor layer may be disposed on the substrate, and include the surface layer region on a side opposite to a side on which the substrate is located.

Accordingly, it is possible to implement a nitride-based semiconductor light-emitting element having a stable operation voltage, even when the nitride-based semiconductor light-emitting element includes a first n-type nitride-based semiconductor layer that is not an n-type substrate, and causes current to flow in a horizontal direction.

For example, the nitride-based semiconductor light-emitting element according to an aspect of the present disclosure may further include a p-type nitride-based semiconductor layer and a p-side electrode laminated in sequence above the first n-type nitride-based semiconductor layer on the side opposite to the side on which the substrate is located.

Accordingly, it is possible to stabilize an operation voltage of an element having p-n junction such as a light-emitting diode element, for example.

For example, the peak concentration of the halogen element in the surface layer region may be higher than a peak concentration of the halogen element at an interface between the p-side electrode and the p-type nitride-based semiconductor layer.

Accordingly, the concentration of the halogen element that can be compensation defect for an acceptor of the p-type nitride-based semiconductor decreases at the interface between the p-side electrode and the p-type nitride-based semiconductor. As a result, it is possible to further stabilize the operation voltage.

A manufacturing method of a nitride-based semiconductor light-emitting element according to an aspect of the present disclosure includes dry etching an n-type nitride-based semiconductor layer, using plasma containing a group IV n-type impurity and a halogen element; and forming an n-side electrode on a surface of the n-type nitride-based semiconductor layer, the surface having been exposed to the plasma in the dry etching. In the manufacturing method, a peak concentration of the group IV n-type impurity in a surface layer region, which includes the surface, of the n-type nitride-based semiconductor layer is at least $1.0 \times 10^{21}$ $cm^{-3}$, and a peak concentration of the halogen element in the surface layer region is at least 10% of the peak concentration of the group IV n-type impurity in the surface layer region.

Accordingly, it is possible to simultaneously carry out adding the group IV n-type impurity and adding the halogen element by dry etching. As a result, it is possible to easily form a surface layer region. Since the peak concentration of the halogen element included in the surface layer region is high, it is possible to inhibit diffusion of the group IV n-type impurity included in the internal region into the n-side electrode. Since the diffusion of the group IV n-type impurity is inhibited, it is possible to inhibit the resistance of the connecting point between the n-type nitride-based semiconductor layer and the n-side electrode from becoming high, and thus excellent ohmic contact can be realized. In this manner, it is possible to easily manufacture a nitride-based semiconductor light-emitting element having stable voltage characteristics in a large-current density operation or a high-temperature operation.

A manufacturing method of a nitride-based semiconductor light-emitting element according to an aspect of the present disclosure includes: dry etching an n-type nitride-based semiconductor layer, using plasma containing a group IV n-type impurity and a halogen element; and forming an n-side electrode on a surface of the n-type nitride-based semiconductor layer, the surface having been exposed to the plasma in the dry etching. In the manufacturing method, the n-type nitride-based semiconductor layer includes Ga, and in an emission spectrum of the plasma at an end time of the dry etching, a peak intensity of a first emission peak resulting from Ga is lower than a peak intensity of a second emission peak resulting from the group IV n-type impurity or the halogen element.

Accordingly, it is possible to adjust the additive amount of the group IV n-type impurity and the halogen element, by performing the dry etching while checking the light emission spectrum. It is thus possible to easily adjust the concentrations of the group IV n-type impurity and the halogen element at the interface between the n-side electrode and the n-type nitride-based semiconductor layer. As a result, it is possible to increase the peak concentration of the halogen element at the interface. In this manner, it is possible to easily manufacture a nitride-based semiconductor light-emitting element having stable voltage characteristics in a large-current density operation or a high-temperature operation.

For example, the group IV n-type impurity may be Si, the halogen element may be Cl, the first emission peak may result from (i) a Ga atom or a Ga ion, or (ii) a molecule containing Ga or a molecule ion containing Ga, and the second emission peak may result from (i) at least one of a Si atom or a Si ion or at least one of a Cl atom or a Cl ion, or (ii) a molecule containing at least one of Si or Cl or a molecule ion containing at least one of Si or Cl.

Accordingly, the surface layer region including Si and Cl can be easily formed by dry etching, etc. with high controllability for an impurity concentration.

For example, the first emission peak may have a center wavelength in a range from at least 294 nm to at most 295 nm, and the second emission peak may have a center wavelength in a range from at least 390 nm to at most 391 nm.

Accordingly, since the change in the first emission peak increases, it is possible to easily control the dry etching while checking the light emission spectrum.

For example, the n-type nitride-based semiconductor layer may include an n-type nitride-based semiconductor substrate, and the manufacturing method may further include: polishing the n-type nitride-based semiconductor substrate prior to the dry etching. The dry etching may include dry etching a polished surface of the n-type nitride-based semiconductor substrate, and a dislocation density of the polished surface that has been dry etched may be at most $1 \times 10^{9}$ $cm^{-2}$.

Accordingly, it is possible to easily implement a thinned nitride-based semiconductor light-emitting element, by including the polishing. In addition, it is possible to easily remove, by the dry etching, damages resulting from the polishing. In other words, since the removal of the damages and the addition of the halogen element can be simultaneously carried out, it is possible to reduce the number of processes.

For example, the dry etching may include dry etching a (0001) plane of the n-type nitride-based semiconductor layer.

Accordingly, it is possible to manufacture a nitride-based semiconductor light-emitting element having a vertical structure.

Hereinafter, an embodiment will be described in detail with reference to the Drawings.

Each of the embodiments described below shows a general or specific example. The numerical values, shapes, materials, constituent elements, the arrangement and connection of the constituent elements, steps, the processing order of the steps, etc. shown in the following embodiments are mere examples, and therefore do not limit the scope of the claims of present disclosure. Among the constituent elements in the embodiments described below, those not recited in the independent claims will be described as optional constituent elements.

In addition, each diagram is a schematic diagram and not necessarily strictly illustrated. Thus, the scales of the drawings, for example, are not necessarily precise. In the drawings, essentially the same constituent elements share the same reference signs, and redundant descriptions will be omitted or simplified.

In this Description, terms indicating relationships between elements, terms indicating the shapes of elements, and value ranges do not have the meanings in the strict sense only, but also represent essentially equivalent meanings and value ranges, and include, for example, deviations of about a few percent.

Also, in this Description, the terms "upper" and "lower" do not indicate the up direction (vertically up) and the down direction (vertically down) in terms of the absolute spatial recognition, but are used as terms defined by a relative positional relationship based on the sequence of lamination in the laminated structure. In addition, the terms "upper", "above", and "lower" are used not only when a constituent element is present between two other constituent elements spaced apart from each other, but also when two constituent elements are disposed in close contact with each other.

Embodiment 1

First, a configuration of a nitride-based semiconductor light-emitting element according to Embodiment 1 will be described with reference to FIG. 1. FIG. 1 is a cross-sectional view illustrating a configuration of semiconductor laser element 1 according to the present embodiment.

Semiconductor laser element 1 is an example of the nitride-based semiconductor light-emitting element. Note that in the present embodiment, the nitride-based semiconductor is a group III-V nitride-based semiconductor. For example, the nitride-based semiconductor is a semiconductor including GaN as the main component, such as GaN, AlGaN, and InGaN. Note that the nitride-based semiconductor may contain a small amount of a group-V element such as P or As.

As illustrated in FIG. 1, semiconductor laser element 1 includes substrate 10, n-type clad layer 12, n-type guide layer 14, light emission layer 16, p-side guide layer 18, electron block layer 20, p-type clad layer 22, p-type contact layer 24, p-side electrode 26, current block layer 28, adhesion auxiliary layer 30, pad electrode 32, and n-side electrode 34. Semiconductor laser element 1 has a ridge structure. In the present embodiment, for convenience of explanation, the direction in which n-side electrode 34 is located with respect to light emission layer 16 is referred to as "lower (the lower layer side)", and the direction in which p-side electrode 26 (and a ridge) is located with respect to light emission layer 16 is referred to as "upper (the upper layer side)".

Table 1 below shows an example of specific configurations of main layers included in semiconductor laser element 1. The specific configuration of each layer is a mere example; the material, thickness, impurity concentration, number of layers, etc., may be varied as appropriate.

TABLE 1

| | | Material | Thickness [nm] | Impurity concentration [cm$^{-3}$] |
|---|---|---|---|---|
| Pad electrode 32 | | Au | 1600 | |
| P-side electrode 26 | | Pt | 35 | |
| | | Pd | 40 | |
| P-type contact layer 24 | | p$^+$-GaN | 10 | $2.00 \times 10^{20}$ |
| | | p-GaN | 50 | $2.00 \times 10^{19}$ |
| P-type clad layer 22 | | p-AlGaN | 409 | $1.00 \times 10^{19}$ |
| | | p-AlGaN | 250 | $2.00 \times 10^{18}$ |
| Electron block layer 20 | | p-AlGaN | 2 | $1.50 \times 10^{19}$ |
| | | p-AlGaN | 5 | $1.50 \times 10^{19}$ |
| P-side guide layer 18 | | GaN | 3 | $1.50 \times 10^{19}$ |
| | | GaN | 6 | undoped |
| | | InGaN | 40 | undoped |
| Light emission layer 16 | Barrier layer | InGaN | 18 | undoped |
| | Well layer | InGaN | 7.5 | undoped |
| | Barrier layer | InGaN | 19 | undoped |
| | Well layer | InGaN | 7.5 | undoped |
| | Barrier layer | InGaN | 92 | undoped |
| N-type guide layer 14 | | GaN | 127 | $5.00 \times 10^{17}$ |
| N-type clad layer 12 | | AlGaN | 3000 | $5.00 \times 10^{17}$ |
| Substrate 10 | | GaN | 85000 | $1.40 \times 10^{18}$ |
| N-side electrode 34 | | Ti | 10 | |
| | | Pt | 35 | |
| | | Au | 300 | |

Substrate 10 is an example of a first n-type nitride-based semiconductor layer that includes a group IV n-type impurity. Specifically, substrate 10 is an example of the n-type nitride-based semiconductor substrate. Substrate 10 is an n-type GaN substrate, for example. The thickness of substrate 10 is at least 50 μm and at most 150 μm, for example. According to the present embodiment, the plane orientation of substrate 10 is (0001).

Substrate 10 includes a group IV n-type impurity added thereto. The group IV n-type impurity are silicon (Si), for example. Note that the group IV n-type impurity included in substrate 10 may be germanium (Ge), for example. As illustrated in Table 1, the impurity concentration of substrate 10 (specifically, Si concentration) is $1.40 \times 10^{18}$ cm$^{-3}$, for example.

As schematically illustrated in FIG. 1 as an enlarged view, substrate 10 includes surface layer region 10a and internal region 10b.

Surface layer region 10a is a portion of substrate 10, and is in contact with n-side electrode 34. Surface 10c of surface layer region 10a which is in contact with n-side electrode 34 is a (000-1) plane. In other words, n-side electrode 34 is disposed on the (000-1) plane of the crystal structure of GaN included in substrate 10. Surface layer region 10a is, for example, a region of a predetermined thickness and includes, of surface 10c of substrate 10, an area in contact with n-side electrode 34 or the entire surface 10c. The thickness of surface layer region 10a is, for example, at least 1 nm and less than 100 nm. Surface layer region 10a contains a halogen element. The halogen element is, for example, chlorine (C).

A peak concentration of the group IV n-type impurity in surface layer region 10a is at least $1.0 \times 10^{21}$ cm$^{-3}$. In addition, a peak concentration of the halogen element in surface layer region 10a is at least 10% of the peak concentration of the group IV n-type impurity in surface layer region 10a. Examples of the distributions of the concentration of the group IV n-type impurity and the concentration of the halogen element in the depth direction will be described later with reference to FIG. 2 and FIG. 3. Note that the peak concentration refers to a maximum value of the concentrations in the concentration distribution in the depth direction.

Internal region 10b is a portion of substrate 10 and is located across surface layer region 10a from n-side electrode 34. Internal region 10b is, for example, a portion of substrate 10 other than surface layer region 10a. On the upper surface of internal region 10b, n-type clad layer 12 is disposed. The concentration of the group IV n-type impurity in internal region 10b is lower than the concentration of the group IV n-type impurity in surface layer region 10a.

N-type clad layer 12 is an example of a second n-type nitride-based semiconductor layer laminated on a (0001) plane opposite to surface layer region 10a of substrate 10. N-type clad layer 12 is provided between substrate 10 and n-type guide layer 14, in contact with each of substrate 10 and n-type guide layer 14. As illustrated in Table 1, n-type clad layer 12 is, for example, an AlGaN layer having a thickness of 3 μm. The composition ratio of Al is 2.6%, for example. Si, an example of the group IV n-type impurity, is added to n-type clad layer 12. The impurity concentration of n-type clad layer 12 is lower than the impurity concentration of substrate 10, and is $5.00 \times 10^{17}$ cm$^{-3}$, for example.

N-type guide layer 14 is an example of a second n-type nitride-based semiconductor layer laminated on the side opposite to surface layer region 10a of substrate 10. N-type guide layer 14 is provided between n-type clad layer 12 and light emission layer 16, in contact with each of n-type clad layer 12 and light emission layer 16. As illustrated in Table 1, n-type guide layer 14 is, for example, a GaN layer having a thickness of 127 nm. Si, an example of the group IV n-type impurity, is added to n-type guide layer 14. The impurity concentration of n-type guide layer 14 is equivalent to the impurity concentration of n-type clad layer 12, lower than the impurity concentration of substrate 10, and is, for example, $5.00 \times 10^{17}$ cm$^{-3}$.

Light emission layer 16 is a layer forming a light emitter of semiconductor laser element 1. Light emission layer 16 is provided between n-type guide layer 14 and p-side guide layer 18, in contact with each of n-type guide layer 14 and p-side guide layer 18.

In the present embodiment, light emission layer 16 has a multi quantum well structure. Specifically, light emission layer 16 includes a plurality of well layers and a plurality of barrier layers alternately laminated one by one. More specifically, as illustrated in Table 1, light emission layer 16 includes two well layers and three barrier layers. Each of the two well layers is an undoped InGaN layer having a thickness of 7.5 nm. The composition ratio of In in the well layers is adjusted to make the oscillation wavelength 405 nm. Each of the three barrier layers is an undoped $In_{0.08}Ga_{0.92}N$ layer, and the thickness thereof is different from one another as illustrated in Table 1.

P-side guide layer 18 includes an example of the p-type nitride-based semiconductor layer laminated above the second n-type nitride-based semiconductor layer. P-side guide layer 18 is provided between light emission layer 16 and electron block layer 20, in contact with each of light emission layer 16 and electron block layer 20. For example, p-side guide layer 18 has a laminated structure including an undoped InGaN layer having a thickness of 40 nm, an undoped GaN layer having a thickness of 6 nm, and a p-type GaN layer having a thickness of 3 nm as illustrated in Table 1. The composition ratio of In in the undoped InGaN layer is 0.3%, for example. The p-type GaN layer is an example of the p-type nitride-based semiconductor layer, and includes Mg added thereto as the p-type impurity. The impurity concentration of the p-type GaN layer is higher than the impurity concentration of substrate 10, and is $1.50 \times 10^{19}$ cm$^{-3}$, for example.

Electron block layer 20 blocks electrons moving from light emission layer 16 toward p-side electrode 26. By providing electron block layer 20, electrons can be more efficiently injected to light emission layer 16, and the light emission efficiency can be enhanced. Electron block layer 20 is provided between p-side guide layer 18 and p-type clad layer 22, in contact with each of p-side guide layer 18 and p-type clad layer 22. For example, electron block layer 20 has a laminated structure including a plurality of p-type AlGaN layers as illustrated in Table 1. The plurality of p-type AlGaN layers are different from one another in thickness and composition ratio of Al. A p-type AlGaN layer in contact with p-side guide layer 18 (the lower layer side) has a thickness of 5 nm, and has a composition ratio of Al that gradually increases from 4% to 36% in the direction from p-side guide layer 18 to p-type clad layer 22. A p-type AlGaN layer in contact with p-type clad layer 22 (the upper layer side) has a thickness of 2 nm, and its composition ratio of Al is 36%. Mg is added to the two p-type AlGaN layers as the p-type impurity. The impurity concentration of the p-type AlGaN layers is equivalent to the impurity concentration of the p-type GaN layer of p-side guide layer 18, and is $1.50 \times 10^{19}$ cm$^{-3}$, for example.

P-type clad layer 22 is an example of the p-type nitride-based semiconductor layer laminated above the second n-type nitride-based semiconductor layer. P-type clad layer 22 is provided between electron block layer 20 and p-type contact layer 24, in contact with each of electron block layer 20 and p-type contact layer 24. As illustrated in FIG. 1, p-type clad layer 22 includes protrusion 22a protruding in the direction from n-side electrode 34 to p-side electrode 26. Specifically, protrusion 22a is a portion of a ridge extending in the [1-100] direction of semiconductor laser element 1. The height of protrusion 22a is 680 nm, for example.

For example, p-type clad layer 22 has a laminated structure including a plurality of p-type AlGaN layers as illustrated in Table 1. The plurality of p-type AlGaN layers are different from one another in thickness and impurity concentration. The respective Al composition ratios of the plurality of p-type AlGaN layers are equal to one another, and are 2.6%, for example. The plurality of p-type AlGaN layers have Mg added thereto as the p-type impurity. The impurity concentration of a p-type AlGaN layer in contact with electron block layer 20 (the lower layer side) is lower than the impurity concentration of electron block layer 20, and is, for example, $2.00 \times 10^{18}$ cm$^{-3}$. The impurity concentration of a p-type AlGaN layer in contact with p-type contact layer 24 (the upper layer side) is higher than the impurity concentration of the p-type AlGaN layer in contact with electron block layer 20 and lower than the impurity concentration of electron block layer 20, and is, for example, $1.00 \times 10^{19}$ cm$^{-3}$.

P-type contact layer 24 is provided between p-type clad layer 22 and p-side electrode 26, in contact with each of p-type clad layer 22 and p-side electrode 26. In the present embodiment, p-type contact layer 24 is provided on protrusion 22a of p-type clad layer 22. In other words, p-type contact layer 24 is part of the ridge of semiconductor laser element 1.

For example, p-type contact layer 24 has a laminated structure including a plurality of p-type GaN layers as illustrated in Table 1. The plurality of p-type GaN layers are different from one another in thickness and impurity concentration. The plurality of p-type GaN layers have Mg added thereto as the p-type impurity. The impurity concentration of a p-type GaN layer in contact with p-type clad layer 22 (the lower layer side) is higher than the impurity concentration of p-type clad layer 22, and is, for example, $2.00 \times 10^{19}$ cm$^{-3}$. The impurity concentration of a p-type GaN layer in contact with p-side electrode 26 (the upper layer side) is higher than the impurity concentration of p-type clad layer 22, and is, for example, $2.00 \times 10^{20}$ cm$^{-3}$. That is to say, the p-type GaN layer in contact with p-side electrode 26 is heavily doped with the p-type impurity.

P-side electrode 26 is provided in contact with p-type contact layer 24. P-side electrode 26 is formed using a metal material. For example, p-side electrode 26 has a laminated structure including a Pd film having a thickness of 40 nm and a Pt film having a thickness of 35 nm. The Pd film is located on the lower layer side, and is in contact with p-type contact layer 24. The surface area of p-side electrode 26 in a plan view is $4.4 \times 10^{-5}$ cm$^2$, for example. Note that a plan view is a view from a direction orthogonal to a principal surface of substrate 10 (for example, the (0001) plane of the GaN crystal structure).

Current block layer 28 is located between pad electrode 32 and p-type clad layer 22, and inhibits a current flowing from pad electrode 32 toward n-side electrode 34. As illustrated in FIG. 1, current block layer 28 is provided on the lateral sides of the ridge of semiconductor laser element 1. Specifically, current block layer 28 covers the lateral surfaces of protrusion 22a of p-type clad layer 22 and the upper surface of p-type clad layer 22 other than the upper surface of protrusion 22a. Note that, current block layer 28 may cover the lateral surfaces of p-type contact layer 24. Current block layer 28 is formed using an electrical insulating material. For example, current block layer 28 is a silicon oxide film having a thickness of 300 nm.

Adhesion auxiliary layer 30 is provided so as to enhance adhesion of pad electrode 32 to current block layer 28. Adhesion auxiliary layer 30 is provided between pad electrode 32 and current block layer 28, in contact with each of pad electrode 32 and current block layer 28. Adhesion auxiliary layer 30 is provided at both sides of the ridge, for example. Adhesion auxiliary layer 30 is formed using a metal material. More specifically, adhesion auxiliary layer 30 has a laminated structure including a Ti film having a thickness of 10 nm and a Pt film having a thickness of 50 nm. The Ti film is located on the lower layer side, and is in contact with current block layer 28.

Pad electrode 32 is provided in contact with p-side electrode 26. As illustrated in FIG. 1, pad electrode 32 covers p-side electrode 26, p-type contact layer 24, current block layer 28, and adhesion auxiliary layer 30. For example, pad electrode 32 is a metal film having a thickness of 1.6 μm, and is formed using Au.

N-side electrode 34 is an example of an n-side electrode which is in contact with the first n-type nitride-based semiconductor layer. N-side electrode 34 is in contact with surface layer region 10a of substrate 10. N-side electrode 34 is formed using a metal material. Specifically, n-side electrode 34 includes: at least one type of metal selected from a group consisting of Ti, Al, Pt, Au, Mo, Sn, In, Ni, Cr, Nb, Ba, Ag, Rh, Ir, Ru, and Hf; or an alloy of at least two types of metal selected from this group For example, as illustrated in Table 1, n-side electrode 34 has a laminated structure including an Au film having a thickness of 300 nm, a Pt film having a thickness of 35 nm, and a Ti film having a thickness of 10 nm. The Ti film is located on the upper layer side, and is in contact with surface layer region 10a. The surface area of n-side electrode 34 in a plan view is $1.0 \times 10^{-3}$ cm$^2$, for example.

Semiconductor laser element 1 having the above configuration emits laser light having an oscillation wavelength of 405 nm (blue-violet), for example. Semiconductor laser element 1 has a chip width of 150 μm, a resonator length of 800 μm, and a ridge width (stripe width) of 7 μm. The light output of semiconductor laser element 1 is 0.7 W at continuous oscillation. The maximum operating current of semiconductor laser element 1 is 0.47 A. Here, the current density of p-side electrode 26 is 1.1 kA cm$^{-2}$, and the current density of n-side electrode 34 is 0.47 kA cm$^{-2}$. The electrode area of n-side electrode 34 is $1.0 \times 10^{-3}$ cm$^2$. The operating voltage of semiconductor laser element 1 is 4.7 V, and the maximum junction temperature in operation is 91 degrees Celsius. Note that these numerical values are mere examples, and may be altered as appropriate.

Note that, although light emission layer 16 has a multiple quantum well structure in the example indicated in Table 1, light emission layer 16 may have a single quantum well structure as indicated in Table 2.

TABLE 2

| | Material | Thickness [nm] | Impurity concentration [cm$^{-3}$] |
|---|---|---|---|
| Pad electrode 32 | Au | 2000 | |
| P-side electrode 26 | Pt | 100 | |
| | Pd | 40 | |
| P-type contact | p$^+$-GaN | 10 | $2.00 \times 10^{20}$ |
| layer 24 | p-GaN | 50 | $2.00 \times 10^{19}$ |
| P-type clad | p-AlGaN | 409 | $1.00 \times 10^{19}$ |
| layer 22 | p-AlGaN | 250 | $2.00 \times 10^{18}$ |
| Electron block | p-AlGaN | 2 | $1.50 \times 10^{19}$ |
| layer 20 | p-AlGaN | 5 | $1.50 \times 10^{19}$ |
| P-side guide | GaN | 3 | $1.50 \times 10^{19}$ |
| layer 18 | GaN | 6 | undoped |
| | InGaN | 60 | undoped |

TABLE 2-continued

| | | Material | Thickness [nm] | Impurity concentration [cm$^{-3}$] |
|---|---|---|---|---|
| Light emission layer 16 | Barrier layer | InGaN | 18 | undoped |
| | Well layer | InGaN | 7.5 | undoped |
| | Barrier layer | InGaN | 190 | undoped |
| N-type guide layer 14 | | GaN | 127 | $5.00 \times 10^{17}$ |
| N-type clad layer 12 | | AlGaN | 3000 | $5.00 \times 10^{17}$ |
| Substrate 10 | | GaN | 85000 | $1.40 \times 10^{18}$ |
| N-side electrode 34 | | Ti | 10 | |
| | | Pt | 35 | |
| | | Au | 300 | |

Semiconductor laser element 1 according to the variation indicated in Table 2 has a configuration different in the layer structure of light emission layer 16 and the thickness of each of InGaN layer on the lower layer side of p-side guide layer 18, the Pt film of p-side electrode 26, and pad electrode 32, as compared the configuration indicated in Table 1. In addition, although not illustrated in Table 1 or Table 2, the thickness of the Pt film of adhesion auxiliary layer 30 also differs. Specifically, the thickness of the Pt film of adhesion auxiliary layer 30 is greater than the case illustrated in Table 1, and is 100 nm, for example.

Light emission layer 16 according to the present variation may include one well layer and two barrier layers. The well layer is an undoped InGaN layer having a thickness of 7.5 nm. The composition ratio of In in the well layer is adjusted to make the oscillation wavelength 405 nm, for example. Each of the two barrier layers is an undoped $In_{0.08}Ga_{0.92}N$ layer, and the thickness thereof is different from each other as indicated in Table 1.

The thickness of the InGaN layer (lower layer side) in contact with n-type guide layer 14 is 190 nm. The thickness of the InGaN layer of p-side guide layer 18 is 60 nm which is greater as compared to the case indicated in Table 1. This allows enhancement of the effect of light confinement to the well layer in the laminating direction, and decrease in loss of a waveguide as low as 2.9 cm$^{-1}$.

Semiconductor laser element 1 according to the present variation emits laser light having an oscillation wavelength of 405 nm, for example. Semiconductor laser element 1 according to the present variation has a chip width of 150 μm, a resonator length of 1200 μm, and a ridge width of 30 μm. The light output of semiconductor laser element 1 according to the present variation is 3.5 W at continuous oscillation. The maximum operating current of semiconductor laser element 1 according to the present variation is 2.4 A. Here, the current density of p-side electrode 26 is 6.2 kA cm$^{-2}$, and the current density of n-side electrode 34 is 1.8 kA cm$^{-2}$. The electrode area of n-side electrode 34 is $1.3 \times 10^{-3}$ cm$^2$. The operating voltage of semiconductor laser element 1 according to the present variation is 4.9 V, and the maximum junction temperature in operation is at least 140 degrees Celsius and at most 150 degrees Celsius. Note that these numerical values are mere examples, and may be altered as appropriate.

According to the present variation, with the ridge width being at least 30 μm, it is possible to decrease the laser light density and inhibit end surface destruction due to light absorption of the laser itself at the end surface of semiconductor laser element 1. In addition, with the resonator length being at least 1200 μm, it is possible to enhance the heat dissipation property of semiconductor laser element 1. Note that, since light emission layer 16 has a single quantum well structure, it is possible to inhibit an increase in an oscillation current threshold and a decrease in slope efficiency in the current-light output characteristics associated with the increase in the resonator length. As described above, with semiconductor laser element 1 according to the present variation, it is possible to achieve a decrease in the oscillation current threshold and a decrease in the operating current.

When light emission layer 16 has a single quantum well structure, the carrier density in operation increases compared to the case of the multi quantum well structure. For that reason, leakage current from light emission layer 16 to p-type clad layer 22 is likely to be generated due to the influence of self-generated heat of semiconductor laser element 1 in operation.

In contrast, according to the present variation, surface layer region 10*a* in contact with n-side electrode 34 contains a large amount of group IV n-type impurities and halogen elements, and thus it is possible to achieve stable voltage characteristics in a large-current density operation and a high-temperature operation (the details of this will be described later). Accordingly, operation voltage variation is small even when semiconductor laser element 1 is caused to operate for a long period of time, and thus it is possible to inhibit an increase in the self-generated heat caused by a voltage increase. Thus, even when light emission layer 16 has a single quantum well structure, it is possible to achieve stable low operating current characteristics. As a result, even in an ultrahigh-power operation in which the laser light output exceeds 3 W, for example, it is possible to ensure a highly reliable operation for a long period of time, and to implement semiconductor laser element 1 having low operating current characteristics.

Note that, the oscillation wavelength of semiconductor laser element 1 is not limited to 405 nm. For example, semiconductor laser element 1 may emit laser light having an oscillation wavelength of 445 nm (blue light). Semiconductor laser element 1 that emits blue light can be implemented with a configuration equivalent to the configuration of semiconductor laser element 1 according to the variation indicated in Table 2. More specifically, a laser element that emits blue laser light can be implemented by adjusting the composition ratio of In in the well layer of light emission layer 16.

Next, specific examples of the concentrations of the group IV n-type impurity and the halogen element in the vicinity of surface layer region 10*a* will be described with reference to FIG. 2 and FIG. 3.

Figure 2:
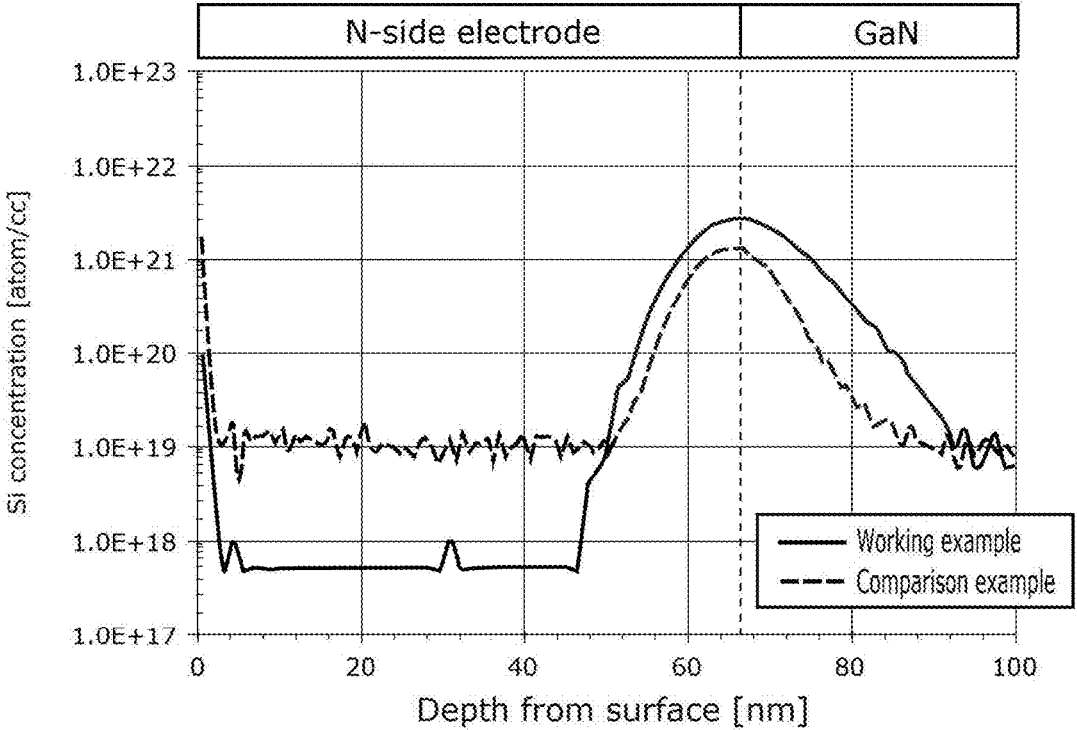
FIG. 2 is a graph illustrating a Si concentration in the vicinity of an interface between an n-side electrode and an n-type semiconductor of the semiconductor laser element according to Embodiment 1.

FIG. 2 is a graph illustrating the Si concentration in the vicinity of the interface between n-side electrode 34 and substrate 10 (n-type semiconductor) of semiconductor laser element 1 according to the present embodiment. FIG. 2 shows a result of a secondary ion mass spectrometry (SIMS) analysis of each of the semiconductor laser elements according to a working example and a comparison example.

As illustrated in FIG. 2, the Si concentration is represented by mount-shaped graphs each having a peak in the vicinity of the interface between n-side electrode 34 and substrate 10. In other words, Si is contained in both n-side electrode 34 and substrate 10. The peak concentration of Si of the working example is approximately $3 \times 10^{21}$ cm$^{-3}$, which is higher than the peak concentration of Si of the comparison example.

The Si concentration in surface layer region 10*a* of substrate 10 is at least $1.0 \times 10^{21}$ cm$^{-3}$. In surface layer region 10*a*, the Si concentration of the working example is higher than the Si concentration of the comparison example. In addition, the Si concentration in internal region 10*b* is lower than the Si concentration in surface layer region 10*a*.

Si contained in n-side electrode 34 is resulting from diffusion of Si added to surface layer region 10*a* of substrate 10. In a region away from substrate 10 in n-side electrode 34 (for example, at a depth in a range from 5 nm to 45 nm), the Si concentration according to the working example is lower than $1.0 \times 10^{18}$ cm$^{-3}$, which is lower than the Si concentration according to the comparison example by at least one digit. In other words, the Si concentration in n-side electrode 34 takes a minimum value at a depth in a range from 5 nm to 45 nm inclusive, from the surface of substrate 10, and the minimum value is lower than $1.0 \times 10^{18}$ cm$^{-3}$.

Figure 3:
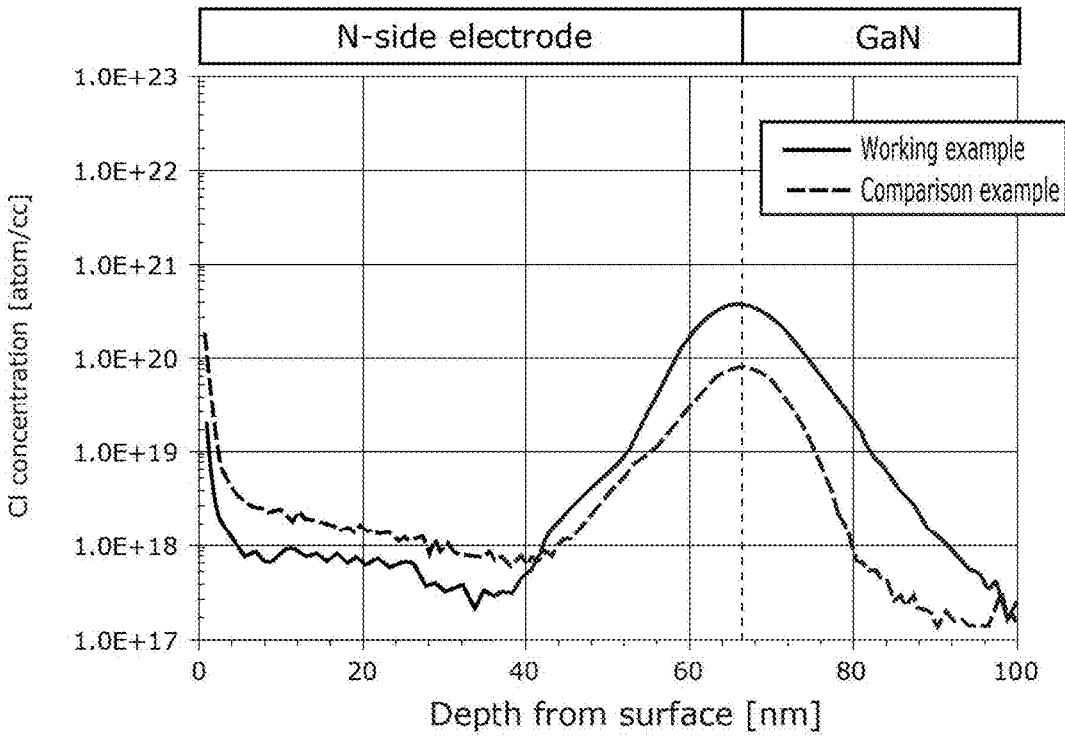
FIG. 3 is a graph illustrating a Cl concentration in the vicinity of the interface between the n-side electrode and the n-type semiconductor of the semiconductor laser element according to Embodiment 1.

FIG. 3 is a graph illustrating the Cl concentration in the vicinity of the interface between n-side electrode 34 and substrate 10 (n-type semiconductor) of semiconductor laser element 1 according to the present embodiment. FIG. 3 shows a result of the SIMS analysis of each of the semiconductor laser elements according to a working example and a comparison example.

As illustrated in FIG. 3, the Cl concentration is represented by mount-shaped graphs each having a peak in the vicinity of the interface between n-side electrode 34 and substrate 10. In other words, Cl is contained in both n-side electrode 34 and substrate 10. The peak concentration of Cl of the working example is approximately $4 \times 10^{20}$ cm$^{-3}$, which is higher than the peak concentration of Cl of the comparison example. In addition, the peak concentration of Cl is at least 10% of the peak concentration of Si; that is, approximately $3 \times 10^{20}$ cm$^{-3}$. The peak concentration of Cl is, for example, lower than 100% of the peak concentration of Si, and may be at most 50% of the peak concentration of Si.

Cl contained in n-side electrode 34 is resulting from diffusion of Cl added to surface layer region 10*a* of substrate 10. The diffusion of Cl is substantially even in both sides from the interface between n-side electrode 34 and substrate 10. More specifically, at a depth of approximately 25 nm from the interface, the Cl concentration is approximately $1.0 \times 10^{18}$ cm$^{-3}$, which is lower than the peak concentration by at least two digits.

As illustrated in FIG. 2 and FIG. 3, Si and Cl are contained at a high concentration in surface layer region 10*a* of semiconductor laser element 1 according to the present embodiment. The resistance of surface layer region 10*a* can be decreased by containing a large amount of Si. On the other hand, when Si is diffused to n-side electrode 34, there is a risk of an increase in the resistance of n-side electrode 34. According to the present embodiment, it is presumed that a large amount of Cl contained in surface layer region 10*a* inhibits diffusion of Si to n-side electrode 34. This allows excellent ohmic contact between n-side electrode 34 and substrate 10. The excellent ohmic contact enables stable voltage characteristics in a large-current density operation and a high-temperature operation.

Figure 4:
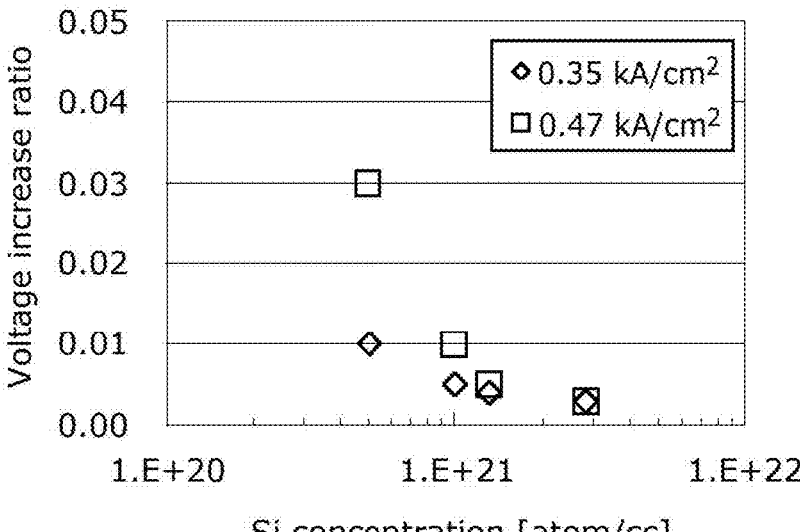
FIG. 4 is a graph illustrating a voltage increase ratio obtained in a large-current density operation of the semiconductor laser element according to Embodiment 1.

FIG. 4 is a graph illustrating a voltage increase ratio obtained in a large-current density operation of semiconductor laser element 1 according to the present embodiment. In FIG. 4, the horizontal axis represents the peak concentration of Si contained in surface layer region 10*a*. The vertical axis represents an increase ratio of operation voltages (i.e., voltage increase ratio) when semiconductor laser element 1 is in operation. The voltage increase ratio is a ratio of (i) a difference between a start voltage at a time of starting an operation and a voltage after a predetermined period has elapsed from the starting the operation to (ii) the start voltage. FIG. 4 shows a voltage increase ratio after 47 hours have elapsed.

As illustrated in FIG. 4, in a large-current density operation in which the current density of surface layer region 10$a$ is 0.47 kA cm$^{-2}$, the voltage increase ratio is as high as 3% when the Si concentration is $5.0 \times 10^{20}$ cm$^{-3}$. In contrast, when the Si concentration is $1.0 \times 10^{21}$ cm$^{-3}$, the voltage increase ratio is suppressed to at most 1%.

Note that, when the current density is 0.35 kA cm$^{-2}$ which is not large, the voltage increase ratio is suppressed to 1% even when the Si concentration is $5.0 \times 10^{20}$ cm$^{-3}$. In other words, when semiconductor laser element 1 according to the present embodiment is used with the current density of at least 0.47 kA cm$^{-2}$, it is possible to more effectively utilize the stable voltage characteristics. Note that the voltage increase ratio is also suppressed to less than 1% even when the current density is 0.35 kA cm$^{-2}$ which is not large. In other words, semiconductor laser element 1 according to the present embodiment has a wide range of current densities that allow a stable operation, and thus can be used under various environments.

Figure 5:
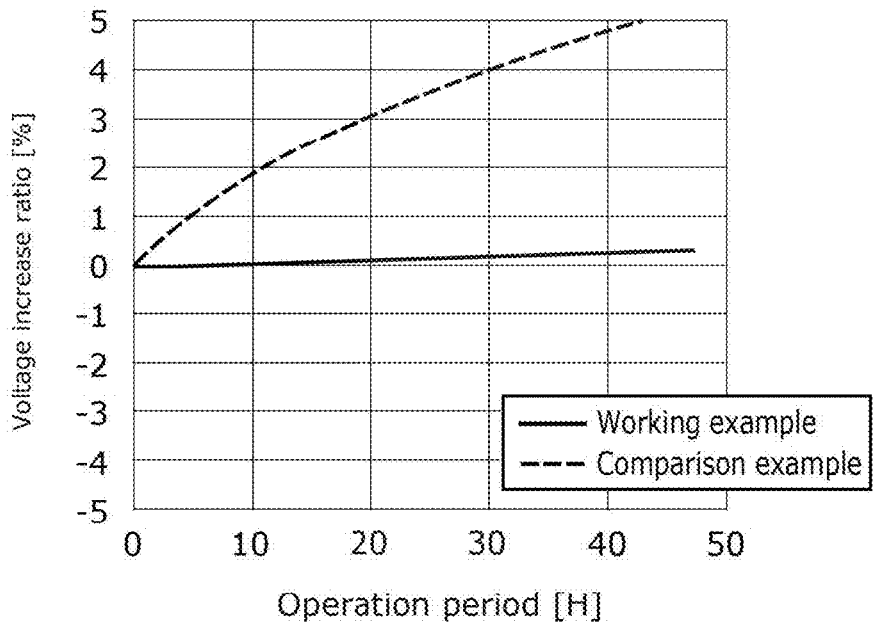
FIG. 5 is a graph illustrating a voltage increase ratio obtained in a high-temperature operation of the semiconductor laser element according to Embodiment 1.

FIG. 5 is a graph illustrating a voltage increase ratio obtained in a high-temperature operation of semiconductor laser element 1 according to the present embodiment. In FIG. 5, the horizontal axis represents an operation period. The vertical axis represents a voltage increase ratio of semiconductor laser element 1. The working example and the comparison example shown in FIG. 5 are equivalent to the working examples and the comparison examples shown in FIG. 2 and FIG. 3. More specifically, the semiconductor laser element according to the comparison example is an element in which the peak concentration of Si in surface layer region 10$a$ is lower than $1.0 \times 10^{21}$ cm$^3$, and the peak concentration of Cl is lower than 10% of the peak concentration of Si. Here, the operation temperature is 67 degrees Celsius.

As illustrated in FIG. 5, in the case of the semiconductor laser element according to the comparison example, the voltage increase ratio increases with the operation period. More specifically, in the case of the semiconductor laser element according to the comparison example, the voltage increase ratio is 4% when 30 hours have elapsed. In contrast, in the case of semiconductor laser element 1 according to the working example, the voltage increase ratio is suppressed to 0.2% even when 40 hours or more have elapsed. As described above, semiconductor laser element 1 according to the present embodiment is capable of operating with a stable operation voltage even when used at an operation temperature of 67 degrees Celsius or higher.

According to the present embodiment, a halogen element is also included at the interface between p-side electrode 26 and a p-type nitride-based semiconductor layer (specifically, p-type contact layer 24) with which p-side electrode 26 is in contact. Here, the halogen element is equivalent to the halogen element included in surface layer region 10$a$. For example, the halogen element here is Cl. Note that the halogen element included at the interface between p-side electrode 26 and p-type contact layer 24 may be different from the halogen element included in surface layer region 10$a$.

Figure 6:
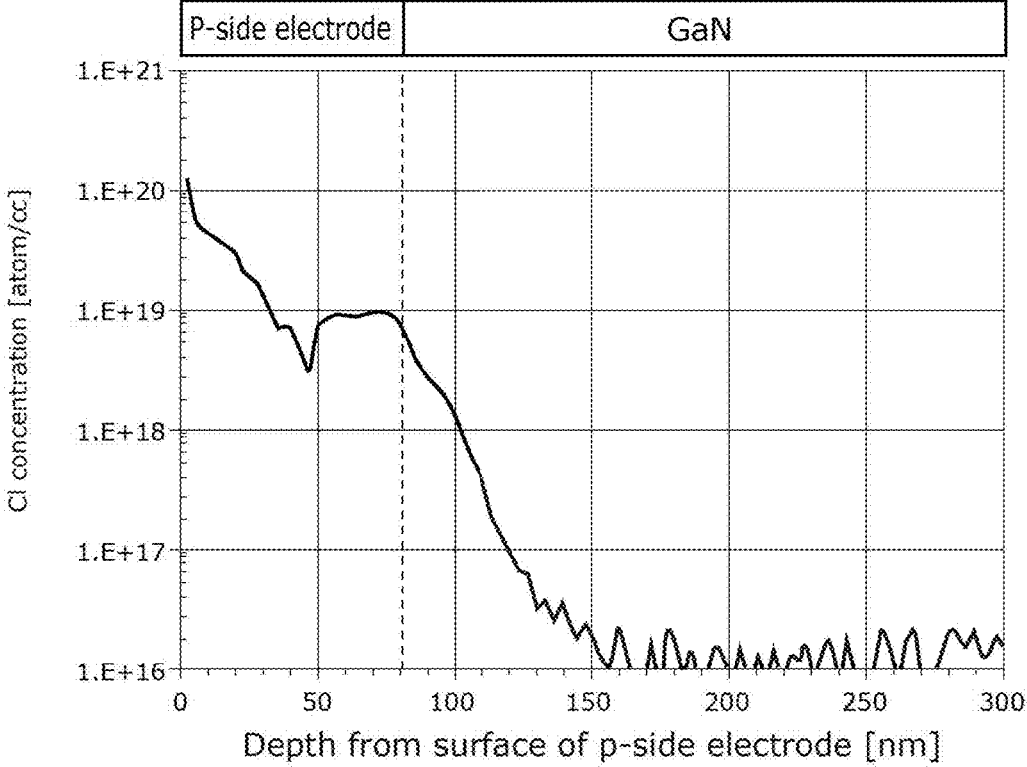
FIG. 6 is a graph illustrating a Cl concentration in the vicinity of the interface between the p-side electrode and the p-type semiconductor of the semiconductor laser element according to Embodiment 1.

FIG. 6 is a graph illustrating the Cl concentration in the vicinity of the interface between p-side electrode 26 and p-type contact layer 24 (p-type semiconductor) of semiconductor laser element 1 according to the present embodiment. FIG. 6 shows a result of the SIMS analysis of semiconductor laser element 1 according to the working example.

Cl that is an example of the halogen element is included in the vicinity of the interface between p-side electrode 26 and p-type contact layer 24. More specifically, as illustrated in FIG. 6, the Cl concentration gradually decreases from the interface between p-side electrode 26 and p-type contact layer 24 toward the inside of p-type contact layer 24. Note that the interface is located at a depth of 75 nm from an upper surface of p-side electrode 26. The Cl concentration is approximately $1.0 \times 10^{19}$ cm$^{-3}$ in the vicinity of the interface, and is approximately $2.0 \times 10^{19}$ cm$^{-3}$ or lower at a depth of approximately 80 nm or more.

According to the present embodiment, the peak concentration of Cl in surface layer region 10$a$ that is in contact with n-side electrode 34 is higher than the peak concentration of Cl at the interface between p-side electrode 26 and p-type contact layer 24. More specifically, as illustrated in FIG. 3, the peak concentration of Cl in surface layer region 10$a$ is approximately $4.0 \times 10^{20}$ cm$^{-3}$, and thus is higher than the peak concentration of Cl at the interface between p-side electrode 26 and p-type contact layer 24, by at least one digit.

For this reason, the concentration of Cl that can be compensation defect for an acceptor of p-type contact layer 24 decreases at the interface between p-side electrode 26 and p-type contact layer 24, and thus it is possible to further stabilize the operation voltage.

Next, a manufacturing method of semiconductor laser element 1 according to the present embodiment will be described with reference to FIG. 7 and FIG. 8A to FIG. 8H.

Figure 7:
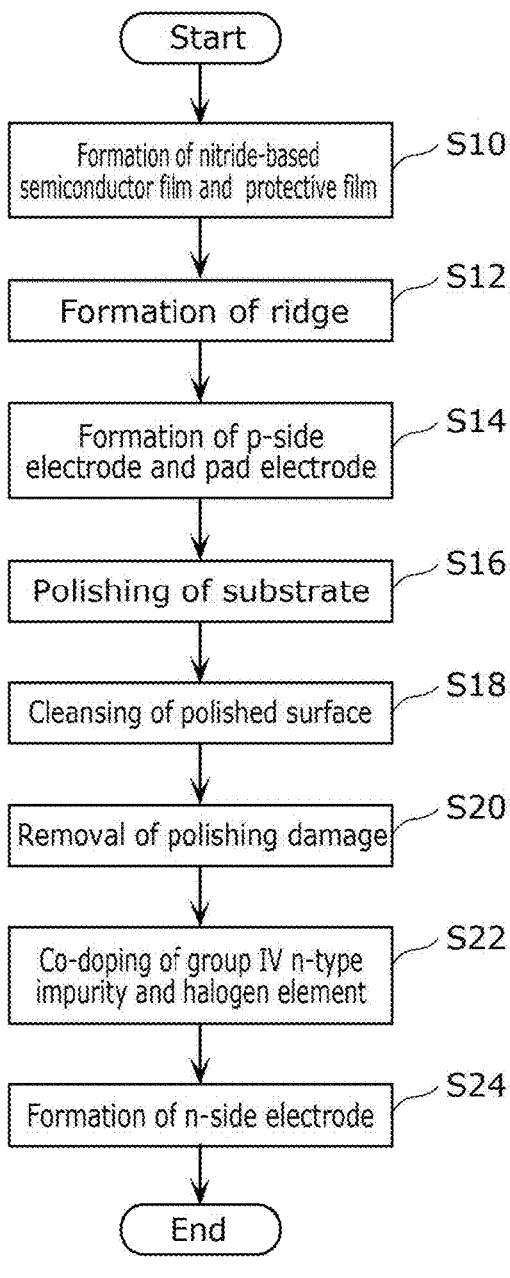
FIG. 7 is a flowchart illustrating a manufacturing method of the semiconductor laser element according to Embodiment 1.

FIG. 7 is a flowchart illustrating a manufacturing method of semiconductor laser element 1 according to the present embodiment. Each of FIG. 8A to FIG. 8H is a cross-sectional view illustrating processing included in the manufacturing method of semiconductor laser element 1 according to the present embodiment.

Figure 8A:
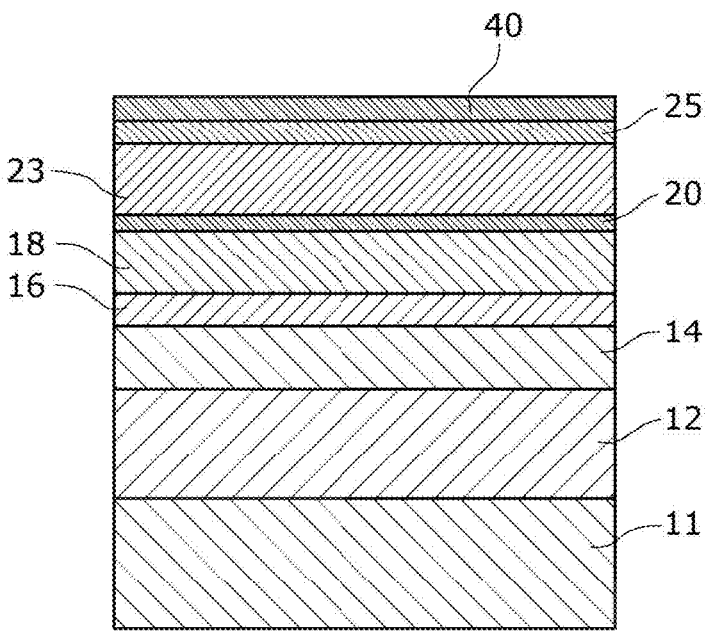
FIG. 8A is a cross-sectional view illustrating laminating of semiconductor films included in the manufacturing method of the semiconductor laser element according to Embodiment 1.

First, as illustrated in FIG. 7, a nitride-based semiconductor film and a protective film are formed (S10). Specifically, as illustrated in FIG. 8A, a plurality of nitride-based semiconductor films are formed above substrate 11 in sequence. The nitride-based semiconductor films are formed, for example, by epitaxial growing method using a metal organic chemical vapor deposition (MOCVD) method, a molecular beam epitaxy (MBE) method, or the like. In this manner, n-type clad layer 12, n-type guide layer 14, emission layer 16, p-side guide layer 18, electron block layer 20, p-type nitride-based semiconductor film 23, and p-type nitride-based semiconductor film 25 are formed above substrate 11 in stated order.

Here, substrate 11 is an n-type nitride-based semiconductor substrate which is thicker than substrate 10. Substrate 11 becomes substrate 10 by having the lower surface polished and dry etched in later processing. P-type nitride-based semiconductor film 23 and p-type nitride-based semiconductor film 25 become p-type clad layer 22 and p-type contact layer 24, respectively, by being patterned for forming a ridge structure.

Subsequent to the formation of the nitride-based semiconductor film, protective film 40 is formed on p-type nitride-based semiconductor film 25 as illustrated in FIG. 8A. Protective film 40 is, for example, an insulating film such as a silicon oxide film, and is formed by a plasma chemical vapor deposition (CVD) method etc. Since protection film 40 is provided, it is possible to protect the surface of p-type nitride-based semiconductor film 25 (p-type contact layer 24) from being damaged at the time of patterning p-type nitride-based semiconductor films 23 and 25.

Next, as illustrated in FIG. 7, a ridge of semiconductor laser element 1 is formed (S12). Specifically, a ridge is formed by removing a portion of each of protective film 40, p-type nitride-based semiconductor film 25, and p-type nitride-based semiconductor film 23, which are positioned at a predetermined region in a plan view. For example, a removal target portion is removed by applying a photosensitive resist, performing photolithography, and performing etching.

Figure 8B:
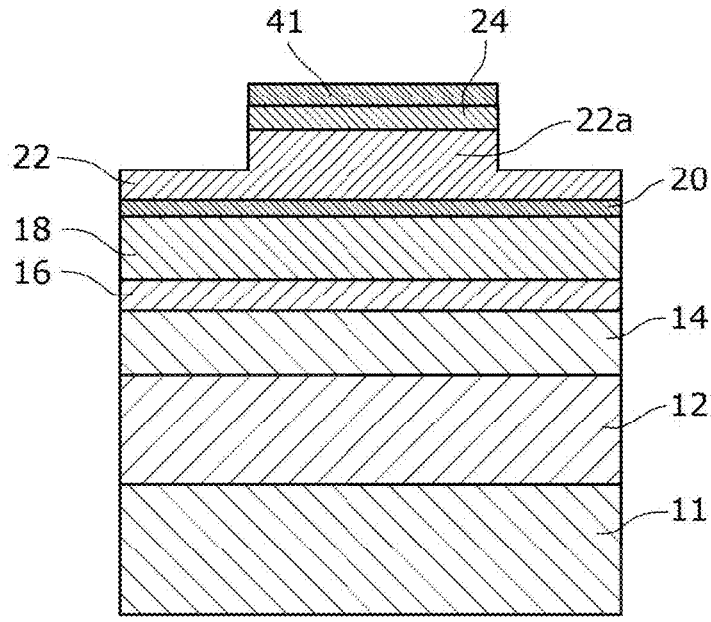
FIG. 8B is a cross-sectional view illustrating forming of a ridge included in the manufacturing method of the semiconductor laser element according to Embodiment 1.

Specifically, as illustrated in FIG. 8B, subsequent to forming protective layer 41 by patterning protective film 40 into a predetermined shape, the photosensitive resist is removed, and p-type nitride-based semiconductor films 25 and 23 are etched using, as a mask, protective layer 41 that has been formed. P-type nitride-based semiconductor films 25 and 23 are etched through dry etching, but may be etched through wet etching. A gas introduced into a chamber at the time of dry etching is, for example, a chlorine-based gas including $BCl_3$ and $Cl_2$. The chlorine-based gas is added to the surface layer portion of p-type nitride-based semiconductor film 25 (i.e., p-type contact layer 24) via protective layer 41.

In this manner, p-type contact layer 24 and protrusion 22a of p-type clad layer 22, namely a ridge is formed as illustrated in FIG. 8B. In a region other than protrusion 22a, protective layer 41 and p-type contact layer 24 are all removed in the laminating direction, and only a portion of p-type clad layer 22 is removed so as to avoid exposing electron block layer 20. The width of protrusion 22a corresponds to the ridge width. Protective layer 41 may be removed after the ridge is formed.

Note that an isolation trench for isolating semiconductor laser element 1 may be formed before or after the ridge is formed. For example, it is possible to form an isolation trench by removing a portion from p-type nitride-based semiconductor film 25 to at least a portion of n-type clad layer 12 located at a region other than an element region of semiconductor laser element 1 in a plan view. In addition, a dummy ridge (a ridge where p-side electrode 26 is not provided) may be provided between the ridge and the isolation trench.

Figure 8C:
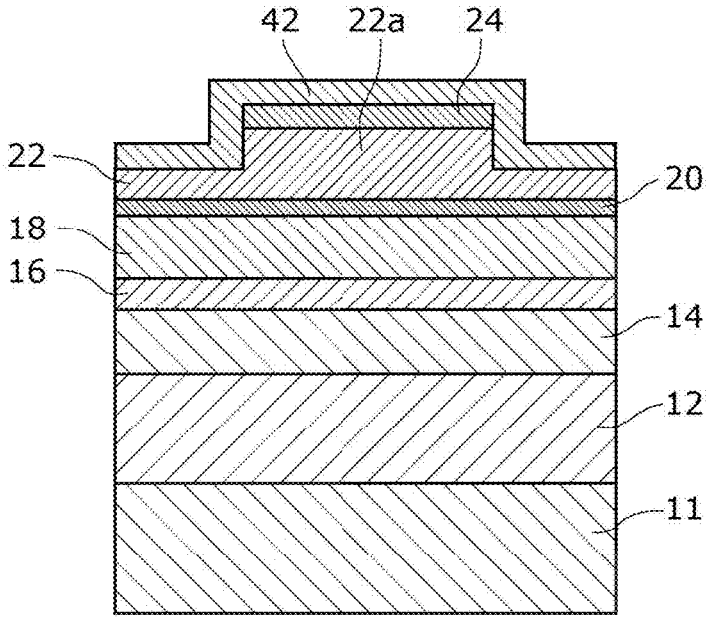
FIG. 8C is a cross-sectional view illustrating forming of a current block layer in the manufacturing method of the semiconductor laser element according to Embodiment 1.
Figure 8D:
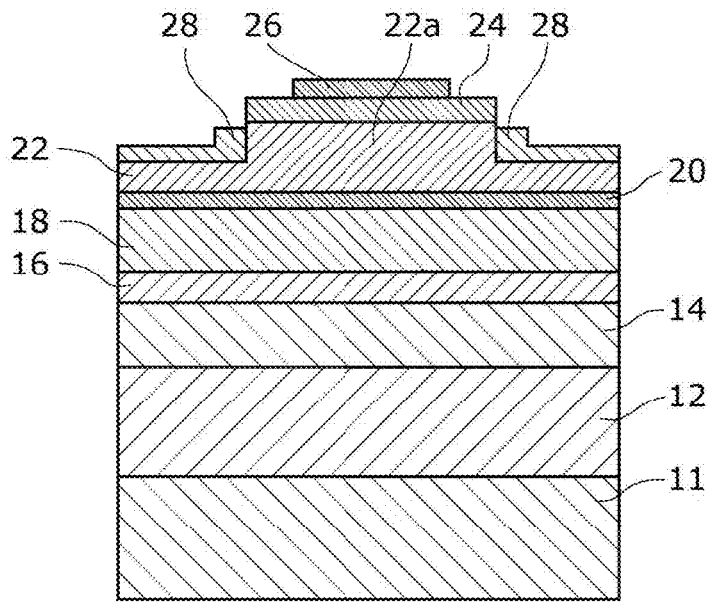
FIG. 8D is a cross-sectional view illustrating forming of a p-side electrode included in the manufacturing method of the semiconductor laser element according to Embodiment 1.

Next, as illustrated in FIG. 7, p-side electrode 26 and pad electrode 32 are formed (S14). Specifically, as illustrated in FIG. 8C, first, insulating film 42 is formed to cover p-type contact layer 24 and an exposed portion of p-type clad layer 22 as a whole. Insulating film 42 is a silicon oxide film, for example, and is formed by a plasma CVD method etc. Next, as illustrated in FIG. 8D, current block layer 28 is formed by patterning insulating film 42 into a predetermined shape. Insulating film 42 is patterned by applying a photosensitive resist, performing photolithography, and performing etching. Insulating film 42 is etched through dry etching, but may be etched through wet etching or a combination of dry etching and wet etching. The dry etching for a silicon oxide film is performed using, for example, a fluorine-based gas including $CF_4$ and $CHF_3$ as an introduction gas.

Furthermore, as illustrated in FIG. 8D, p-side electrode 26 having a predetermined shape is formed on p-type contact layer 24. Specifically, by applying a photosensitive resist and performing photolithography, a resist layer having an opening only in the upper portion of the ridge (i.e., a portion of p-type contact layer 24) is formed. Next, a Pd film and a Pt film are formed in sequence on the resist layer formed. Metal films such as the Pd film and the Pt film are formed by, for example, a vapor deposition method or a sputtering method. After the metal films are formed, p-side electrode 26 is formed on p-type contact layer 24 by a lift-off method.

Note that p-side electrode 26 may be formed by forming metal films on the entire surface and then patterning the metal films by etching, for example.

Figure 8E:
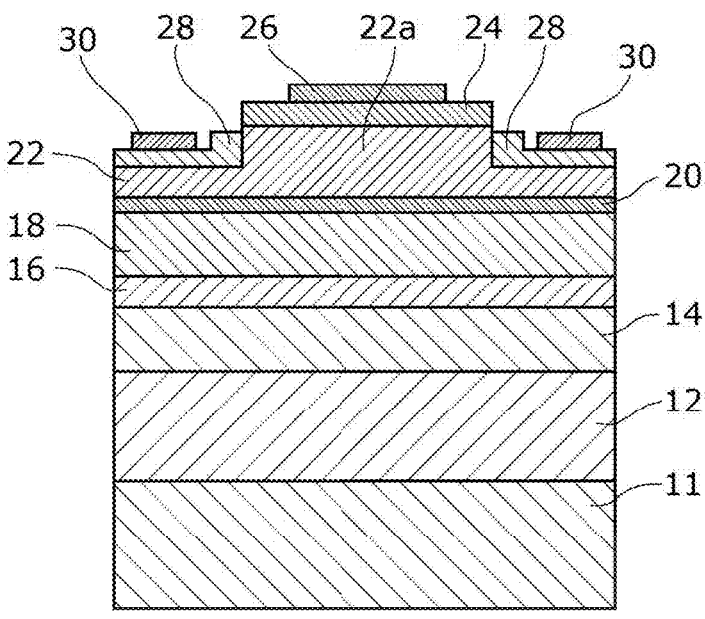
FIG. 8E is a cross-sectional view illustrating forming of an adhesion auxiliary layer included in the manufacturing method of the semiconductor laser element according to Embodiment 1.

Next, as illustrated in FIG. 8E, adhesion auxiliary layer 30 having a predetermined shape is formed on current block layer 28. Specifically, in the same manner as p-side electrode 26, adhesion auxiliary layer 30 is formed by applying a photosensitive resist, performing photolithography, forming metal films, and patterning the metal films by a lift-off method, in sequence. The metal film is formed by laminating a Ti film and a Pt film, by a vapor deposition method or a sputtering method. Adhesion auxiliary layer 30 is formed only on current block layer 28, and is not in contact with p-type contact layer 24 or p-side electrode 26.

Figure 8F:
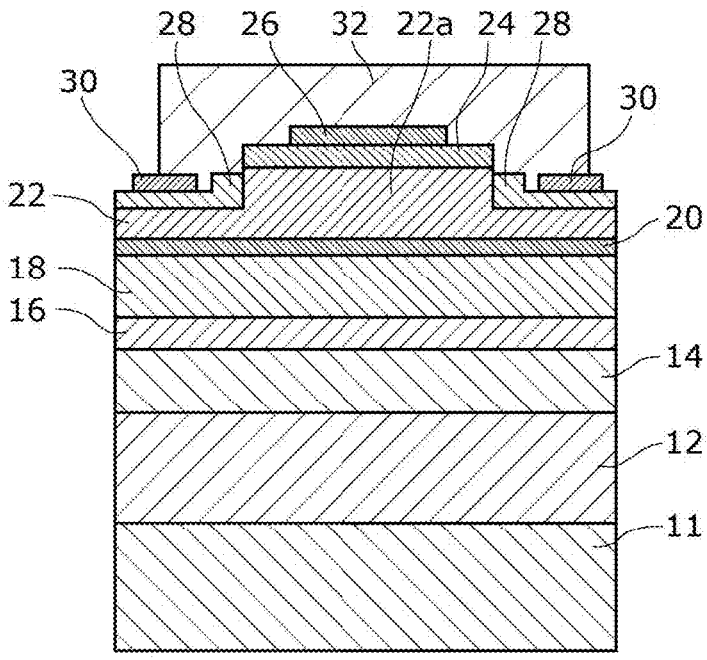
FIG. 8F is a cross-sectional view illustrating forming of a p-side pad electrode included in the manufacturing method of the semiconductor laser element according to Embodiment 1.

Next, as illustrated in FIG. 8F, pad electrode 32 is formed to cover p-side electrode 26, adhesion auxiliary layer 30, and current block layer 28. Specifically, in the same manner as p-side electrode 26, pad electrode 32 is formed by applying a photosensitive resist, performing photolithography, forming metal films, and patterning the metal films by a lift-off method, in sequence. The metal film is an Au film formed by a vapor deposition method, a sputtering method, or a plating method.

Figure 8G:
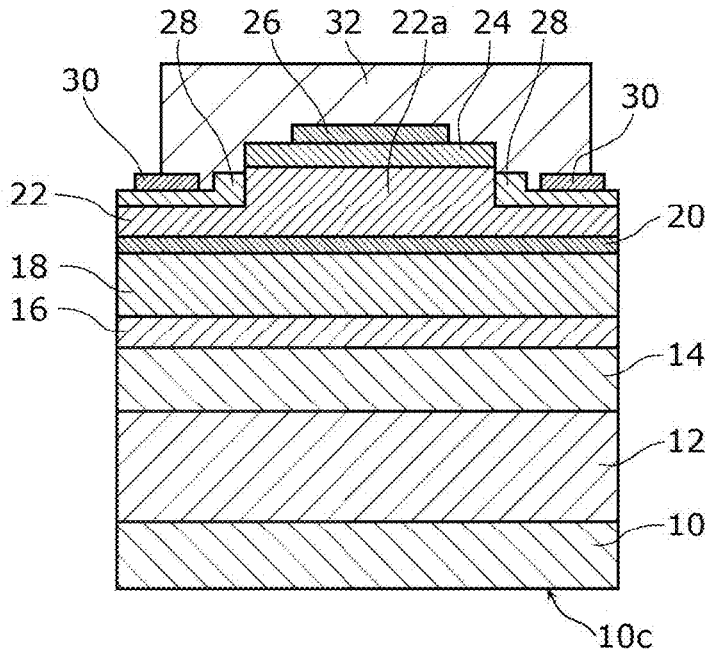
FIG. 8G is a cross-sectional view illustrating polishing of an n-type nitride-based semiconductor substrate included in the manufacturing method of the semiconductor laser element according to Embodiment 1.

Next, substrate 11 is polished as illustrated in FIG. 7 (S16). Polishing is performed by chemical mechanical polishing (CMP), for example. Through the polishing, the thickness of substrate 11 is decreased, thereby forming thinned substrate 10 as illustrated in FIG. 8G. At this time, damage is applied to a polished surface of substrate 10, and dislocation is formed with a density of approximately $10 \times 10^{10}$ cm$^{-2}$.

Next, surface 10c of substrate 10 which has been polished is cleansed as illustrated in FIG. 7 (S18). Specifically, an organic substance attached to the polished surface 10c is removed through cleansing with an organic substance and ashing processing using oxygen plasma.

Next, the damage remaining on the polished surface 10c is removed (S20). Furthermore, the group IV n-type impurity and the halogen element are co-doped from a surface 10c side of substrate 10 (S22). In this manner, surface layer region 10a including the group IV n-type impurity and the halogen element is formed on substrate 10. Here, the dislocation density of surface layer region 10a is decreased to at most $10 \times 10^9$ cm$^{-2}$, for example, at most $10 \times 10^6$ cm$^{-2}$.

In the present embodiment, removal of the damage (S20) and co-doping (S22) are simultaneously performed by dry etching using an inductively super magnetron (ISM) method. Specifically, substrate 10 is dry etched using plasma containing a group IV n-type impurity and a halogen element.

Figure 8H:
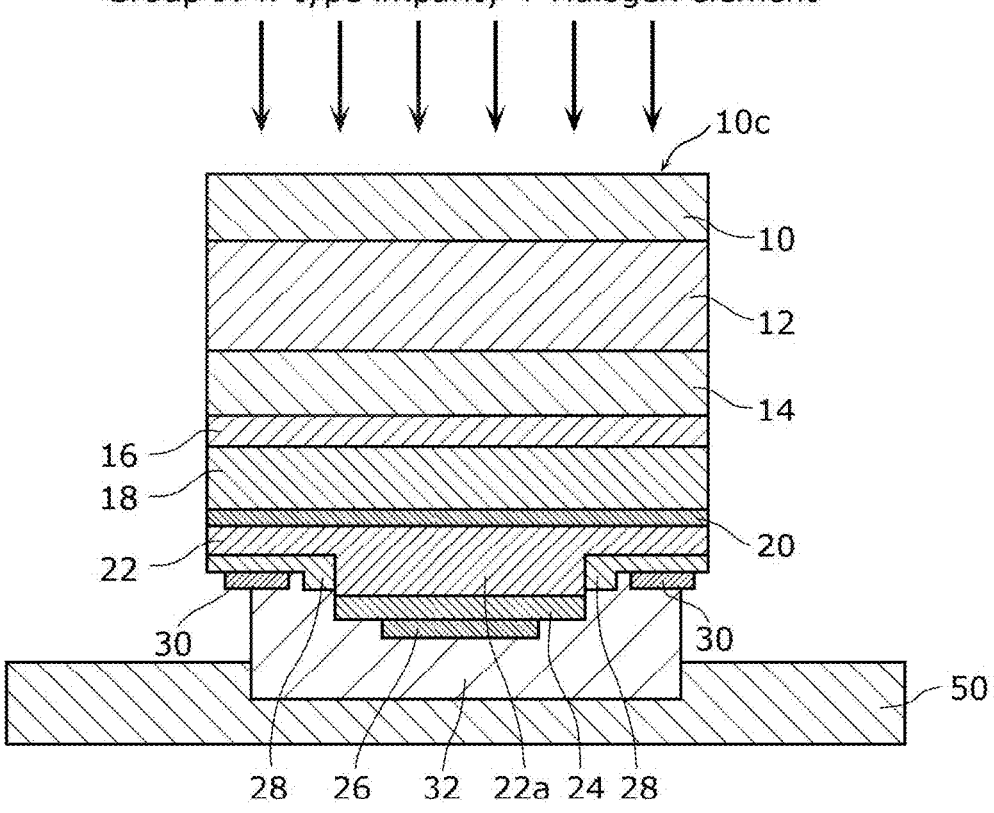
FIG. 8H is a cross-sectional view illustrating dry etching of the n-type nitride-based semiconductor substrate included in the manufacturing method of the semiconductor laser element according to Embodiment 1.

For example, as illustrated in FIG. 8H, dry etching is performed from the surface 10c side in a state in which semiconductor laser element 1 which has been polished and on which n-side electrode 34 is not yet formed is mounted on silicon tray 50 such that the polished surface 10c is exposed. By performing the dry etching, it is possible to remove the region damaged by polishing and to add Si and Cl to the surface thereof (and surface layer region 10a). The details of the dry etching will be described later.

Lastly, as illustrated in FIG. 7, n-side electrode 34 is formed on surface 10c that has been exposed to plasma by dry etching (S24). Specifically, n-side electrode 34 is formed by applying a photosensitive resist, performing photolithography, forming metal films, and patterning the metal films by a lift-off method, in sequence. The metal film includes, for example, a Ti film, a Pt film, and an Au film, and formed by a vapor deposition method or a sputtering method.

With the above-described processing, semiconductor laser element 1 illustrated in FIG. 1 is manufactured.

The following describes the details of the dry etching of substrate 10 with reference to FIG. 9 to FIG. 12.

Figure 9:
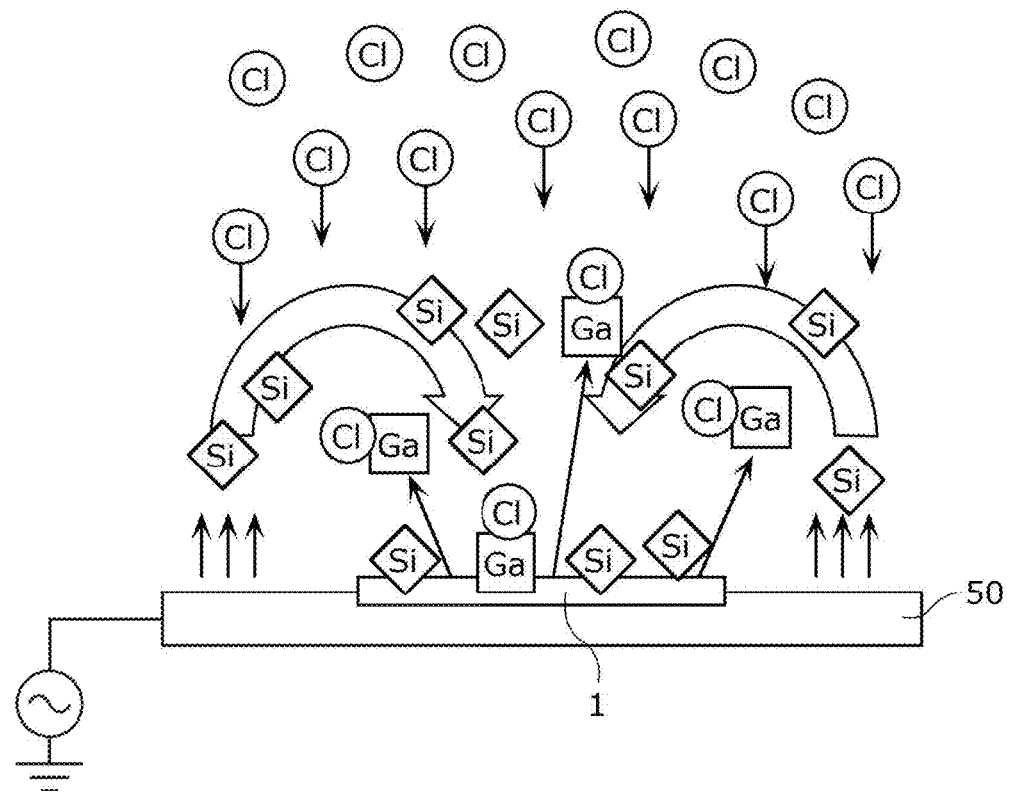
FIG. 9 is a diagram schematically illustrating entrance and exit of atoms or ions in the dry etching included in the manufacturing method of the semiconductor laser element according to Embodiment 1.

FIG. 9 is a diagram schematically illustrating entrance and exit of atoms or ions in the dry etching included in the manufacturing method of semiconductor laser element 1 according to the present embodiment. In this dry etching, $Cl_2$ gas is used. The feed rate of $Cl_2$ gas is 45 sccm, for example.

As illustrated in FIG. 9, the surface of surface layer region 10*a* of substrate 10 of semiconductor laser element 1 is etched by Cl ions that have been ionized by plasma generated above silicon tray 50. As a result of the etching performed on surface layer region 10*a*, Ga is released as an ion or a molecule. At this time, some of the Cl ions are taken into surface layer region 10*a*.

Furthermore, Cl ions or Cl radicals also etch the surface of silicon tray 50. Silicon tray 50 is a support base including semiconductor laser element 1, and serves as a supply source of Si to be added to surface layer region 10*a*. Si ions released from silicon tray 50 are taken into surface layer region 10*a*.

In the present embodiment, surface treatment is performed on silicon tray 50 such that Si ions are readily released by etching. More specifically, the surface of silicon tray 50 is treated with hydrofluoric acid. With this, the oxide film formed on the surface of silicon tray 50 can be removed, and thus it is possible to increase Si exposed to the surface. As a result, it is possible to increase the amount of Si ions that are released. In addition to the hydrofluoric acid treatment, or instead of the hydrofluoric acid treatment, silicon tray 50 may be subjected to smoothing. In this case as well, it is possible to increase the amount of Si ions that are released. The amount of Si added to surface layer region 10*a* can be increased by increasing the amount of Si ions.

In the dry etching, a plasma emission spectrum has a unique peak resulting from a substance contained in plasma. It is possible to control the progress of dry etching; that is, the additive amount of the group IV n-type impurity and the halogen element, by checking the temporal changes of the unique peak.

Figure 10:
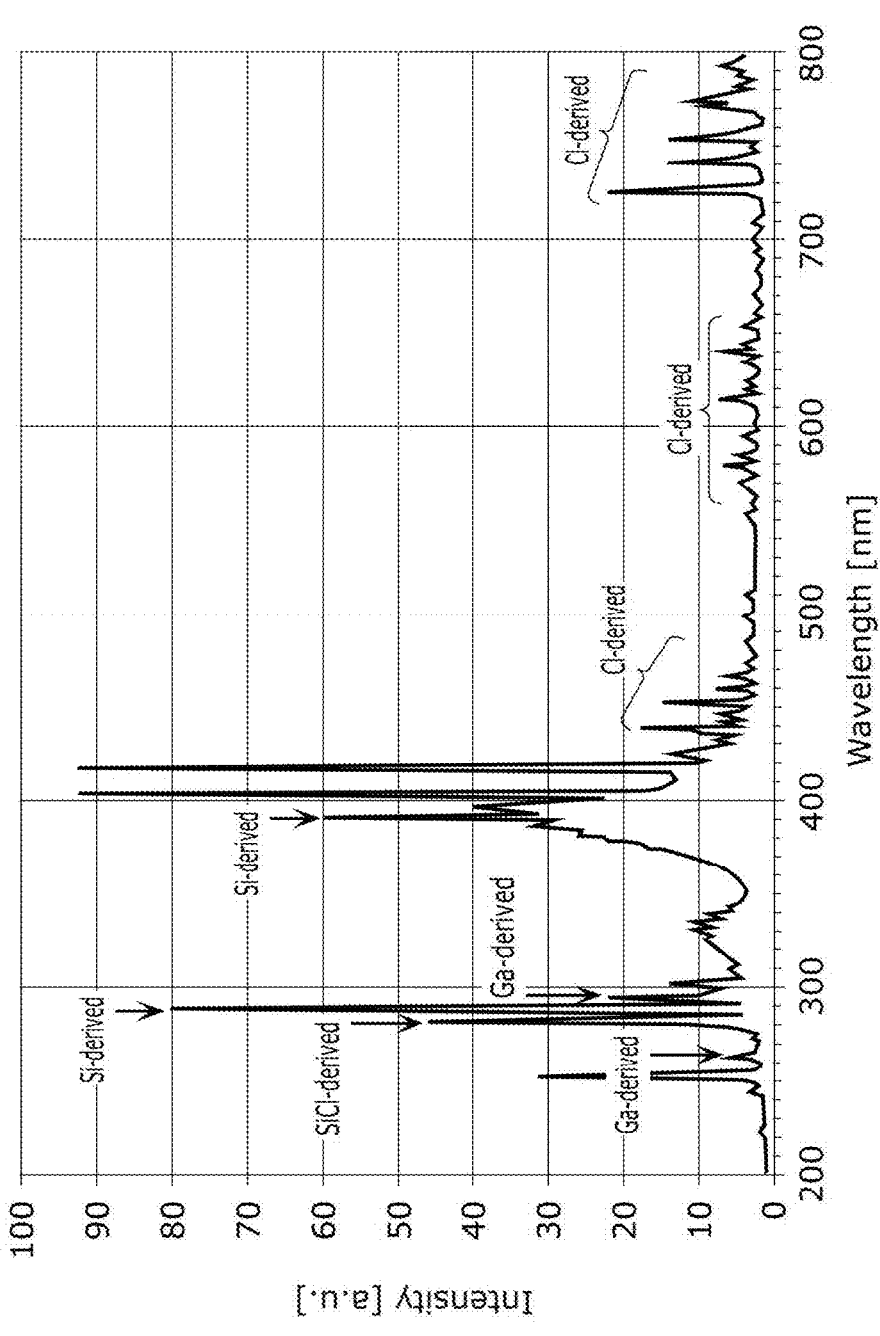
FIG. 10 is a diagram illustrating a plasma emission spectrum at an end time of the dry etching included in the manufacturing method of the semiconductor laser element according to Embodiment 1.

FIG. 10 is a diagram illustrating a plasma emission spectrum at an end time of the dry etching included in the manufacturing method of semiconductor laser element 1 according to the present embodiment. Note that the end time refers to a point immediately before the end, and means, for example, timing included in one second immediately before a time point at which power supply for generating plasma is stopped. In FIG. 10, the horizontal axis represents an emission wavelength. The vertical axis represents an intensity of light having a corresponding wavelength.

As illustrated in FIG. 10, the plasma emission spectrum has a plurality of peaks. The plurality of peaks include a first emission peak resulting from Ga and a second emission peak resulting from the group IV n-type impurity or the halogen element.

The first emission peak is specifically a peak resulting from (i) a Ga atom or a Ga ion, or (ii) a molecule containing Ga or a molecule ion containing Ga. For example, the peak having a center wavelength in a range from at least 294 nm to at most 295 nm is one example of the first emission peak. Since Ga is released from substrate 10, a high intensity of the first emission peak means that etching has been performed smoothly on substrate 10, and a low intensity of the first emission peak means that etching has not been performed much on substrate 10.

The second emission peak is specifically a peak resulting from (i) at least one of a Si atom or a Si ion or at least one of a Cl atom or a Cl ion, or (ii) a molecule including at least one of Si or Cl or a molecule ion including at least one of Si or Cl. For example, the peak having a center wavelength in a range from at least 390 nm to at most 391 nm is a typical emission peak resulting from Si, and is an example of the second emission peak. Since Si is released from silicon tray 50, a high intensity of the second emission peak resulting from Si means that etching has been performed smoothly on silicon tray 50, and a low intensity of the second emission peak resulting from Si means that etching has not been performed much on silicon tray 50.

From the above, it is possible to track the progress of dry etching, by checking the temporal changes in the first emission peak and the second emission peak.

Figure 11:
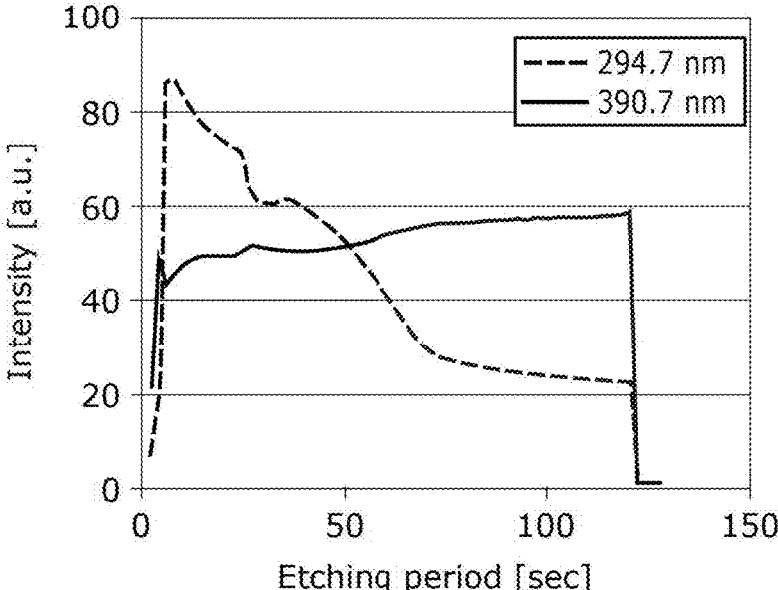
FIG. 11 is a diagram illustrating temporal changes in a peak intensity of an emission peak in the dry etching included in the manufacturing method of the semiconductor laser element according to Embodiment 1.

FIG. 11 is a diagram illustrating temporal changes in a peak intensity of the emission peak in the dry etching included in the manufacturing method of semiconductor laser element 1 according to the present embodiment. In FIG. 11, a peak that has a center wavelength at 294.7 nm and results from Ga is a first emission peak, and a peak that has a center wavelength at 390.7 nm and results from Si is a second emission peak. FIG. 11 illustrates the temporal changes in the intensity of each of the first emission peak and the second emission peak. Here, each of the peak intensities corresponds to an etching rate. For example, when an intensity of the peak that has a center wavelength at 294.7 nm and results from Ga is high, the etching rate for substrate 10 is high, and when the peak intensity is low, the etching rate for substrate 10 is low.

As illustrated in FIG. 11, immediately after the start of dry etching, the intensity of the first emission peak resulting from Ga is higher than the intensity of the second emission peak resulting from Si. Although the intensity of the second emission peak slightly increases until the end time, the intensity is substantially kept constant. In other words, it can be seen that Si ions are stably released from silicon tray 50.

In contrast, the intensity of the first emission peak reaches the peak immediately after the start, and then gradually decreases until the end time. At the end time, the intensity of the first emission peak is lower than the intensity of the second emission peak. More specifically, a large number of the molecules containing Ga, for example, are released by etching on substrate 10 immediately after the start, whereas the amount of Ga released is small immediately before the end. It can be seen that, immediately before the end, a large number of Si ions released from silicon tray 50 are added to surface layer region 10*a*.

As described above, it becomes possible to determine, by the temporal changes in emission peaks, that etching on substrate 10 is dominantly performed and addition of Si has not been performed much immediately after the start, whereas addition of Si is dominantly performed and etching has not been performed much on substrate 10.

Figure 12:
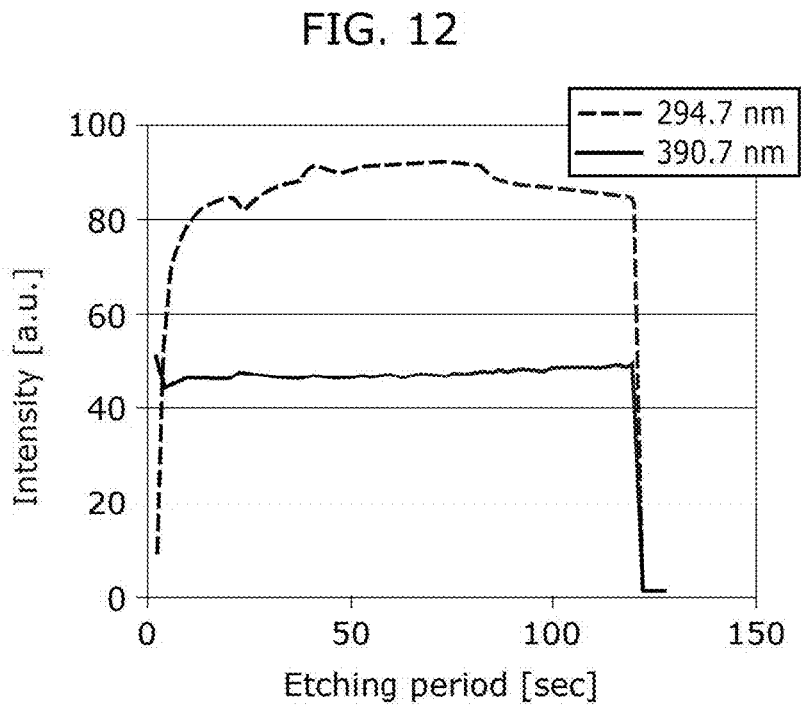
FIG. 12 is a diagram illustrating temporal changes in a peak intensity of an emission peak in dry etching included in a manufacturing method of a semiconductor laser element according to a comparison example.

FIG. 12 is a diagram illustrating temporal changes in a peak intensity of the emission peak in dry etching included in a manufacturing method of a semiconductor laser element according to a comparison example. The semiconductor laser element according to the comparison example illustrated in FIG. 12 is the semiconductor laser element according to the comparison example illustrated in FIG. 2 and FIG. 3. Specifically, in a manufacturing method of the semiconductor laser element according to the comparison example, surface treatment is not performed on silicon tray 50. In addition, the amount of $Cl_2$ introduction gas in the manufacturing method of the semiconductor laser element according to the comparison example is greater than the amount of Cl$_2$ introduction gas in the manufacturing method of semiconductor laser element 1 according to the working example.

As illustrated in FIG. 12, in the dry etching of the semiconductor laser element according to the comparison example, the intensity of the first emission peak is higher than the intensity of the second emission peak from immediately after the start to immediately before the end. In other words, dry etching on substrate 10 is dominantly performed and addition of Si is not much performed in substantially throughout the dry etching. As a result, in the semiconductor laser element according to the comparison example, the peak concentration of Si is low, and the peak concentration of Cl is also low, as illustrated in FIG. 2 and FIG. 3.

Note that the center wavelength of the emission peak to be checked is not limited to the above-described example. For example, as illustrated in FIG. 10, an emission peak that is at around 262 nm and results from Ga may be used as the first emission peak. Alternatively, an emission peak that is at around 290 nm and results from Si may be used as the second emission peak. In addition, any one of a series of emission peaks that appear from 720 nm to 800 nm and result from Cl may be used as the second emission peak.

Figure 13:
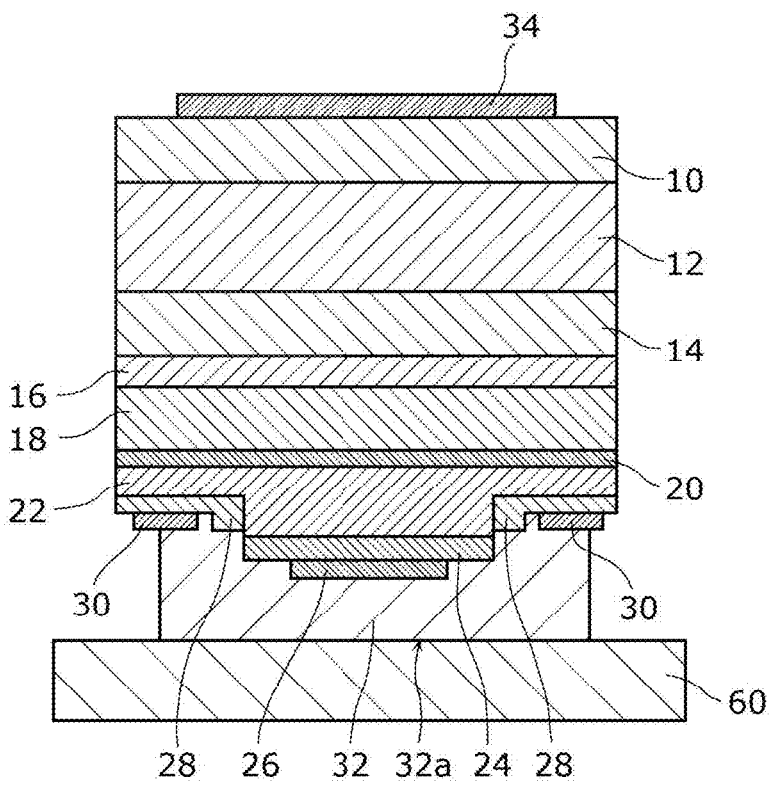
FIG. 13 is a cross-sectional view illustrating an example of mounting the semiconductor laser element according to Embodiment 1 on a submount.

Semiconductor laser element 1 according to the present embodiment is used while connected to a submount. FIG. 13 is a cross-sectional view illustrating an example of mounting, on submount 60, semiconductor laser element 1 according to the present embodiment.

As illustrated in FIG. 13, in semiconductor laser element 1, pad electrode 32 connected to p-side electrode 26 is connected to submount 60. In other words, principal surface 32a of pad electrode 32 is connected to submount 60. Principal surface 32a is included in semiconductor laser element 1, and is on the side opposite to surface layer region 10a relative to internal region 10b in the laminating direction.

In semiconductor laser element 1, light emission layer 16 is a source of heat generation. The operation voltage of semiconductor laser element 1 can be stabilized by efficiently releasing generated heat to submount 60. As illustrated in Table 1, for example, substrate 10 and n-type clad layer 12 which have thicknesses greater than the other layers are located between light emitting layer 16 and n-side electrode 34. For that reason, the distance from light emission layer 16 to submount 60 when submount 60 is connected to pad electrode 32 is shorter than the distance from light emission layer 16 to submount 60 when submount 60 is connected to n-side electrode 34.

Accordingly, as illustrated in FIG. 13, it is possible to enhance the heat dissipation property of semiconductor laser element 1 by connecting semiconductor laser element 1 to submount 60 on the p-side. As a result, the operation voltage can be further stabilized.

Note that semiconductor laser element 1 need not necessarily include pad electrode 32, and p-side electrode 26 may be directly connected to submount 60. When the amount of heat dissipation is small due to low light output, n-side electrode 34 of semiconductor laser element 1 may be connected to submount 60.

Note that, in the present embodiment, a GaN (0001) plane substrate is used as a substrate to form a nitride-based semiconductor layer on the (0001) plane and form an n-side electrode on the (000-1) plane that is the rear surface of the substrate; however, a GaN substrate having a different plane orientation may be used. The n-side electrode may be formed on a non-polar plane. The method according to the present disclosure can also be applied, for example, when a nitride-based semiconductor layer is formed on an a-pane substrate and an n-side electrode is formed on {11-20} plane that is the rear surface of the substrate, or when a nitride-based semiconductor layer is formed on an m-plane substrate and an n-side electrode is formed on {1-100} plane that is the rear surface of the substrate. Alternatively, the n-side electrode may be formed on a semipolar plane. The method according to the present disclosure can also be applied, for example, when a nitride-based semiconductor layer is formed on {11-22} plane substrate and an n-side electrode is formed on {-1-12-2} plane that is the rear surface of the substrate, or when a nitride-based semiconductor layer is formed on {1-101} plane substrate and an n-side electrode is formed on {-110-1} plane that is the rear surface of the substrate.

Furthermore, for example, although the above embodiments have provided descriptions of a semiconductor laser element whose oscillation wavelength is 405 nm, the present disclosure is applicable also to a semiconductor laser element whose oscillation wavelength is at least 365 nm and at most 540 nm by changing the configuration of the light emission layer (the composition ratio of In, for example) etc.

For example, by setting input current to approximately at least 2 A and at most 10 A, and setting input voltage to approximately at least 3.5 V and at most 6 V for a semiconductor laser element whose ridge width (stripe width) is approximately at least 8 μm and at most 100 μm and whose resonator length is approximately at least 800 μm and at most 5000 μm, it is possible to realize a semiconductor laser element having optical characteristics for emitting laser light having a wavelength band of approximately at least 365 nm and at most 390 nm and having light output of approximately at least 1 W and at most 5 W.

For example, by setting input current to approximately at least 2 A and at most 10 A, and setting input voltage to approximately at least 4 V and at most 6 V for a semiconductor laser element whose ridge width (stripe width) is approximately at least 30 μm and at most 100 μm and whose resonator length is approximately at least 1200 μm and at most 5000 μm, it is possible to realize a semiconductor laser element having optical characteristics for emitting laser light having a wavelength band of approximately at least 390 nm and at most 420 nm and having light output of approximately at least 3 W and at most 10 W.

For example, by setting input current to approximately at least 4 A and at most 15 A, and setting input voltage to approximately at least 4 V and at most 7 V for a semiconductor laser element whose ridge width (stripe width) is approximately at least 50 μm and at most 150 μm and whose resonator length is approximately at least 1300 μm and at most 5000 μm, it is possible to realize a semiconductor laser element having optical characteristics for emitting laser light having a wavelength band of approximately at least 420 nm and at most 460 nm and having light output of approximately at least 6 W and at most 15 W.

For example, by setting input current to approximately at least 4 A and at most 15 A, and setting input voltage to approximately at least 4 V and at most 7 V for a semiconductor laser element whose ridge width (stripe width) is approximately at least 30 μm and at most 150 μm and whose resonator length is approximately at least 1200 μm and at most 5000 μm, it is possible to realize a semiconductor laser element having optical characteristics for emitting laser light having a wavelength band of approximately at least 460 nm and at most 500 nm and having light output of approximately at least 3 W and at most 15 W.

For example, by setting input current to approximately at least 4 A and at most 15 A, and setting input voltage to approximately at least 4.5 V and at most 7 V for a semiconductor laser element whose ridge width (stripe width) is approximately at least 40 μm and at most 150 μm and whose resonator length is approximately at least 1300 μm and at most 5000 μm, it is possible to realize a semiconductor laser element having optical characteristics for emitting laser light having a wavelength band of approximately at least 500 nm and at most 540 nm and having light output of approximately at least 2 W and at most 10 W.

For example, each of the above semiconductor laser elements may be a multiple-emitter semiconductor laser element having a plurality of (for example, approximately 60) stripes that are current-constricted in stripes.

Embodiment 2

Next, Embodiment 2 will be described.

Embodiment 1 has descried, as an example of the nitride-based semiconductor light-emitting element, a semiconductor laser element having a vertical structure in which n-side electrode 34 and p-side electrode 26 are disposed with substrate 10 interposed therebetween. In contrast, Embodiment 2 will describe, as an example of the nitride-based semiconductor light-emitting element, a light-emitting diode element in which an n-side electrode and a p-side electrode are provided on one surface side of a substrate. Note that the following description will focus on the aspects different from Embodiment 1, and omit or simplify the common aspects.

Figure 14:
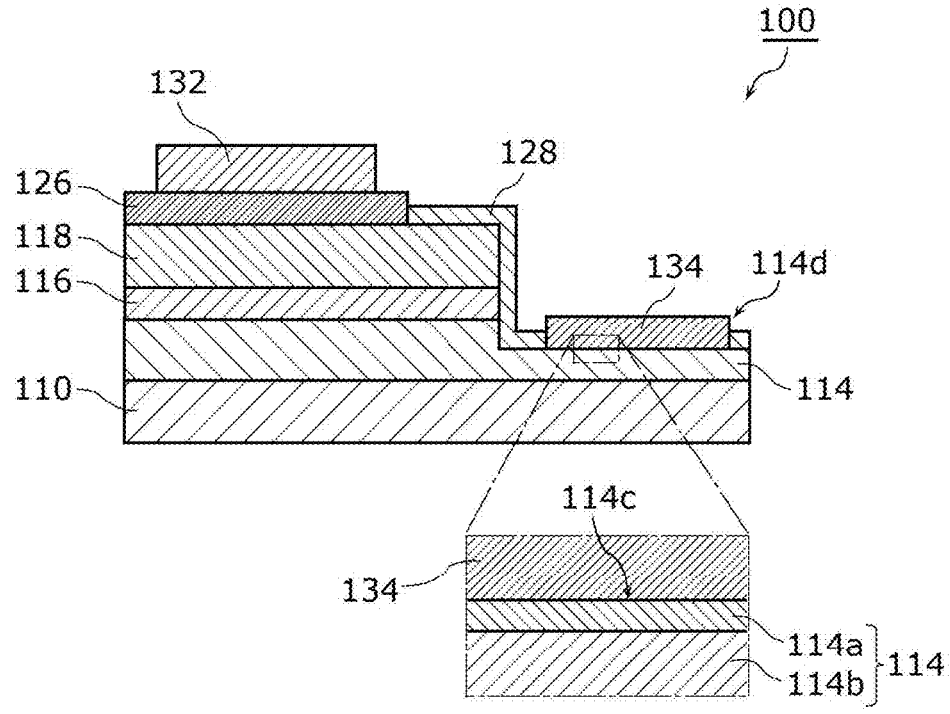
FIG. 14 is a cross-sectional view illustrating a light-emitting diode element according to Embodiment 2.

FIG. 14 is a cross-sectional view illustrating light-emitting diode element 100 according to the present embodiment. As illustrated in FIG. 14, light-emitting diode element 100 includes substrate 110, first n-type nitride-based semiconductor layer 114, light emission layer 116, p-type nitride-based semiconductor layer 118, p-side electrode 126, insulating film 128, metal bump 132, and n-side electrode 134. In the present embodiment, for convenience of explanation, the direction in which substrate 110 is located with respect to light emission layer 116 is referred to as "lower (the lower layer side)", and the opposite direction is referred to as "upper (the upper layer side)".

A first n-type nitride-based semiconductor layer that includes a group IV n-type impurity is provided on the upper surface of substrate 110. Substrate 110 is, for example, an insulating C-plane sapphire substrate, but may be a sapphire substrate of another plane orientation or a semiconductor substrate such as a nitride-based semiconductor substrate, a Si substrate, or a SiC substrate. The thickness, shape, and dimensions of substrate 110 are not particularly limited.

First n-type nitride-based semiconductor layer 114 is an example of the n-type nitride-based semiconductor that includes a group IV n-type impurity. First n-type nitride-based semiconductor layer 114 includes, for example, Si that is an example of the group IV n-type impurity. First n-type nitride-based semiconductor layer 114 is provided in contact with one of the principal surfaces of substrate 110. Note that a buffer layer may be provided between first n-type nitride-based semiconductor layer 114 and substrate 110. First n-type nitride-based semiconductor layer 114 is, for example, an n-type GaN layer. The thickness and impurity concentration of first n-type nitride-based semiconductor layer 114 may be equivalent to, for example, the thickness and impurity concentration of n-type clad layer 12 according to Embodiment 1.

As illustrated in FIG. 14, first n-type nitride-based semiconductor layer 114 includes recess 114d. Recess 114d is provided in a region not overlapping with light emission layer 116 in a plan view. This gives first n-type nitride-based semiconductor layer 114 one thickness in the region overlapping with light emission layer 116 in a plan view and another thickness in the region not overlapping with light emission layer 116 in a plan view. These thicknesses are different from one another. For example, the lateral surface of recess 114d is flush with the end surfaces of light emission layer 116 and p-type nitride-based semiconductor layer 118. N-side electrode 134 is provided on bottom surface 114c of recess 114d that is part of first n-type nitride-based semiconductor layer 114.

As schematically illustrated in FIG. 14 as an enlarged partial view, first n-type nitride-based semiconductor layer 114 includes surface layer region 114a and internal region 114b at a location overlapping with recess 114d in a plan view.

Surface layer region 114a is a portion of first n-type nitride-based semiconductor layer 114 that is in contact with n-side electrode 134. The surface of surface layer region 114a in contact with n-side electrode 134, namely, bottom surface 114c, is a (0001) plane. Surface layer region 114a is, for example, a region of a predetermined thickness and includes, of bottom surface 114c, an area in contact with n-side electrode 134 or the entire bottom surface 114c. The thickness of surface layer region 114a is, for example, at least 1 nm and less than 100 nm. Surface layer region 114a includes Cl that is an example of a halogen element.

Internal region 114b is a portion of first n-type nitride-based semiconductor layer 114, and is located across surface layer region 114a from n-side electrode 134. In other words, internal region 114b is located between surface layer region 114a and substrate 110.

Surface layer region 114a and internal region 114b correspond to surface layer region 10a and internal region 10b according to Embodiment 1, respectively. More specifically, the relationship of the Si concentration and the relationship of the Cl concentration between surface layer region 114a and internal region 114b are equivalent to the relationship of the Si concentration and the relationship of the Cl concentration between surface layer region 10a and internal region 10b, and are as described in Embodiment 1.

Light emission layer 116 is a layer forming a light emitter of light-emitting diode element 100. Light emission layer 116 is provided between first n-type nitride-based semiconductor layer 114 and p-type nitride-based semiconductor layer 118, in contact with each of first n-type nitride-based semiconductor layer 114 and p-type nitride-based semiconductor layer 118. Light emission layer 116 is patterned into a predetermined shape, and does not overlap with n-side electrode 134 in a plan view. Light emission layer 116 has a multi quantum well structure or a single quantum well structure. Light emission layer 116 may have the same configuration as, for example, light emission layer 16 according to Embodiment 1.

P-type nitride-based semiconductor layer 118 is an example of a p-type nitride-based semiconductor layer laminated on a side of the first n-type nitride-based semiconductor layer opposite the side thereof where substrate 110 is provided. P-type nitride-based semiconductor layer 118 is provided between light emission layer 116 and p-side electrode 126, in contact with each of light emission layer 116 and p-side electrode 126. P-type nitride-based semiconductor layer 118 is patterned into a predetermined shape, and does not overlap with n-side electrode 134 in a plan view.

P-type nitride-based semiconductor layer 118 has the same plan view shape and dimensions as light emission layer 116. P-type nitride-based semiconductor layer 118 is, for example, an AlGaN layer having Mg, which is an example of a p-type impurity, added thereto. The thickness and impurity concentration of p-type nitride-based semiconductor layer 118 may be equivalent to, for example, the thickness and impurity concentration of p-type clad layer 22 according to Embodiment 1. In addition, an upper layer portion of p-type nitride-based semiconductor layer 118 which is in contact with p-side electrode 126 may have the same configuration as p-type contact layer 24 according to Embodiment 1.

P-side electrode 126 is provided in contact with p-type nitride-based semiconductor layer 118. P-side electrode 126 is formed using a metal material. P-side electrode 126 has the same configuration as, for example, p-side electrode 26 according to Embodiment 1. The surface area of p-side electrode 126 in a plan view is $4.8 \times 10^{-3}$ cm$^2$, for example. P-side electrode 126 does not overlap with surface layer region 114a in a plan view.

Insulating film 128 covers part of the upper surface of p-type nitride-based semiconductor layer 118 which is uncovered by p-side electrode 126, the end surface of p-type nitride-based semiconductor layer 118, the end surface of light emission layer 116, and part of recess 114d which is uncovered by n-side electrode 134. In other words, insulating film 128 is located between p-side electrode 126 and n-side electrode 134 in a plan view, and inhibits short-circuit between p-side electrode 126 and n-side electrode 134. Insulating film 128 is, for example, a silicon oxide film, and has the same configuration as the configuration of current block layer 28 according to Embodiment 1.

Metal bump 132 is provided in contact with p-side electrode 126. When light-emitting diode element 100 is connected to submount 60 (see FIG. 13), metal bump 132 electrically connects p-side electrode 126 and the wiring pattern provided on submount 60. Metal bump 132 is an Au bump or a solder bump, for example.

N-side electrode 134 is an example of an n-side electrode which is in contact with the first n-type nitride-based semiconductor layer. N-side electrode 134 is in contact with surface layer region 114a of first n-type nitride-based semiconductor layer 114. N-side electrode 134 has the same configuration as, for example, n-side electrode 34 according to Embodiment 1. The surface area of n-side electrode 134 in a plan view is $6.0 \times 10^{-4}$ cm$^2$, for example.

Light-emitting diode element 100 having the above configuration emits blue light, for example. The chip width of light-emitting diode element 100 is 784 µm. The maximum operating current of light-emitting diode element 100 is 1.4 A. Here, the current density of p-side electrode 126 is 0.3 kAcm$^{-2}$, and the current density of n-side electrode 134 is 2.3 kAcm$^{-2}$. The operating voltage of light-emitting diode element 100 is 3.8 V, and the maximum junction temperature in operation is 150 degrees Celsius. Note that these numerical values are mere examples, and may be altered as appropriate.

Surface layer region 114a in contact with n-side electrode 134 contains a large amount of group IV n-type impurities and halogen elements in the present embodiment as well. Accordingly, it is possible to inhibit the resistance of the connecting portion between first n-type nitride-based semiconductor layer 114 and n-side electrode 134 from becoming high, and thus excellent ohmic contact can be realized. As a result, it is possible to implement light-emitting diode element 100 having stable voltage characteristics in a large-current density operation or a high-temperature operation.

Next, a manufacturing method of light-emitting diode element 100 according to the present variation will be described with reference to FIG. 15, FIG. 16A, and FIG. 16B.

Figure 15:
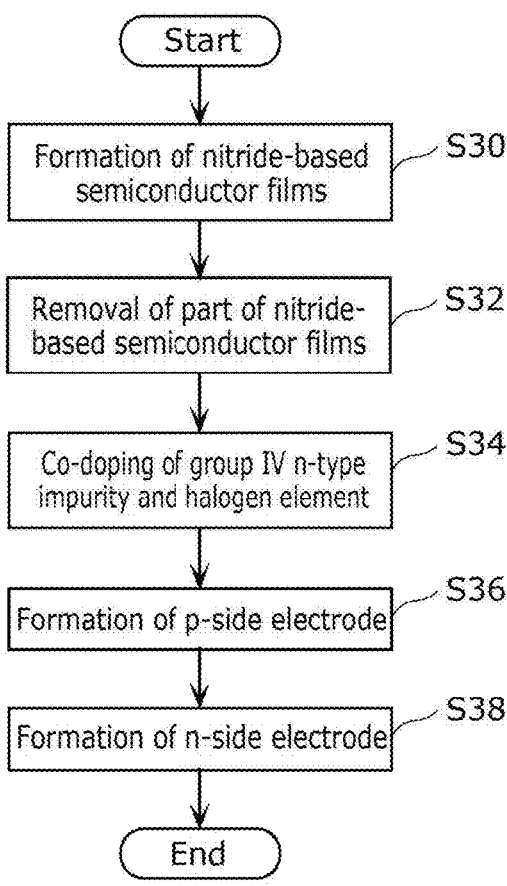
FIG. 15 is a flowchart illustrating a manufacturing method of the light-emitting diode element according to Embodiment 2.
Figure 16A:
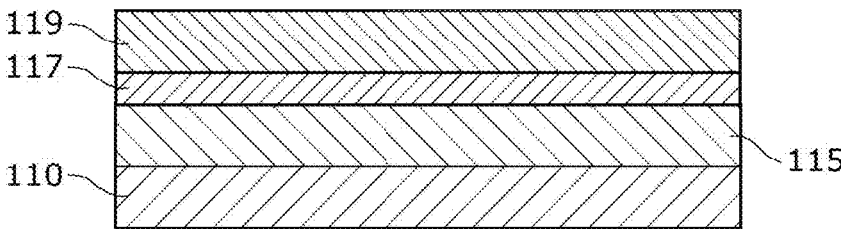
FIG. 16A is a cross-sectional view illustrating laminating of semiconductor layers included in the manufacturing method of the light-emitting diode element according to Embodiment 2.
Figure 16B:
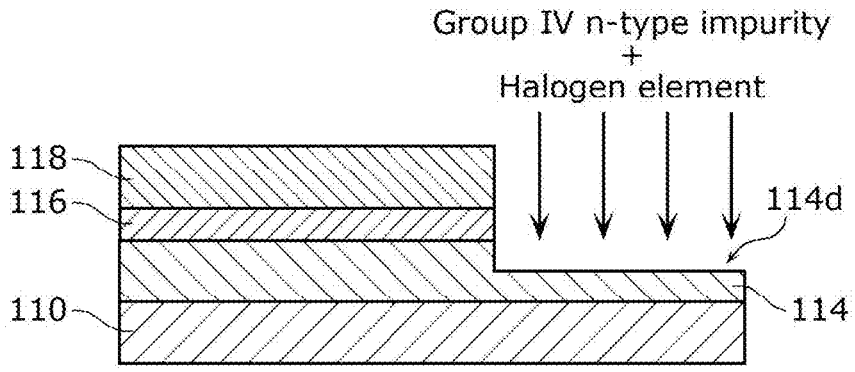
[FIG. 16B]

FIG. 15 is a flowchart illustrating a manufacturing method of light-emitting diode element 100 according to the present embodiment. Each of FIG. 16A and FIG. 16B is a cross-sectional view illustrating processing included in the manufacturing method of light-emitting diode element 100 according to the present embodiment.

As illustrated in FIG. 15, a plurality of nitride-based semiconductor films are formed above substrate 110 (S30). Specifically, as illustrated in FIG. 16A, after a low-temperature buffer layer (not illustrated) is formed on substrate 110, n-type nitride-based semiconductor film 115, nitride-based semiconductor film 117, and p-type nitride-based semiconductor film 119 are formed in the stated sequence. The nitride-based semiconductor films are formed, for example, by epitaxial growing method using an MOCVD method, an MBE method, or the like.

Next, part of the plurality of nitride-based semiconductor films formed is removed, as illustrated in FIG. 15 (S32). Specifically, part of p-type nitride-based semiconductor film 119, part of nitride-based semiconductor film 117, and part of n-type nitride-based semiconductor film 115 that are located in a predetermined region in a plan view are removed in the stated sequence by dry etching. With this, as illustrated in FIG. 16B, p-type nitride-based semiconductor layer 118 and light emission layer 116 patterned into predetermined shapes and recess 114d of first n-type nitride-based semiconductor layer 114 are formed.

According to the present embodiment, dry etching is performed after a hard mask is formed. The hard mask is formed by applying a photosensitive resist, performing photolithography, etching, and peeling the photosensitive resist in sequence, after forming a silicon oxide film, a silicon nitride film, or the like.

Furthermore, as illustrated in FIG. 15, the group IV n-type impurity and the halogen element are co-doped on bottom surface 114c of recess 114d which is a surface exposed as a result of removing part of the nitride-based semiconductor film (S34). In this manner, surface layer region 114a including the group IV n-type impurity and the halogen element is formed in first n-type nitride-based semiconductor layer 114. After the co-doping, p-side electrode 126 is formed (S36). After that, n-side electrode 134 is formed (S38).

According to the present embodiment, the group IV n-type impurity and the halogen element are co-doped by dry etching in the same manner as Embodiment 1. In other words, removal of part of the nitride-based semiconductor films (S32) and co-doping (S34) are performed sequentially in the same chamber. More specifically, the etching conditions are changed during the dry etching.

According to the present embodiment, substrate 110 is mounted on a quartz tray. When a silicon tray is used, Si released from the silicon tray works in such a way to cancel the p-type of p-type nitride-based semiconductor film 119, or makes undoped nitride-based semiconductor film 117 p-type, and thus the silicon tray is not used at least in etching on p-type nitride-based semiconductor film 119 or on undoped nitride-based semiconductor film 117. Use of the quartz tray makes it possible to inhibit the release of the ions of the group IV n-type impurity from the tray.

Under the first etching conditions (the first conditions), the introduction gas is mixed gas of BCl$_3$ gas and Cl$_2$ gas.

Specifically, the gas flow rate of $BCl_3$ gas is 13.2 sccm, the gas flow rate of $Cl_2$ gas is 4.8 sccm, and the pressure in the chamber is set to 0.6 Pa. The power to be supplied is 150 W, and the bias to be applied to substrate 110 is 34 W. Etching is performed under the first conditions until p-type nitride-based semiconductor film 119 and nitride-based semiconductor film 117 in a region where n-side electrode 134 is formed are removed, and part of n-type nitride-based semiconductor film 115 is removed. Specifically, the first conditions are maintained until the depth of n-type nitride-based semiconductor film 115 removed and the depth of recess 114*d* become substantially identical.

After the etching under the first conditions ends, the etching conditions are changed to the second conditions. Under the second conditions, the introduction gas is $SiCl_4$ gas, and the gas flow rate is 30 sccm. The pressure in the chamber is the same as the pressure of the first conditions. The power to be supplied is less than the power of the first conditions, and is 120 W, for example. The bias to be applied to substrate 110 is greater than the bias of the first conditions, and is 100 W, for example.

When the etching under the first conditions and the etching under the second conditions are performed sequentially in the same chamber, the silicon tray that has served as the supply source of Si in Embodiment 1 cannot be used, as described above. Accordingly, under the second conditions, the introduction gas is used as a supply source of Si and Cl, by using a gas containing both Si and Cl. This allows efficiently supplying Si and Cl to surface layer region 114*a* from bottom surface 114*c* exposed to plasma of dry etching.

Note that the specific numerical values included in the first conditions and the second conditions are mere examples. For example, any conditions may be used as the first conditions, as long as the nitride-based semiconductor film is properly removed. Likewise, any conditions may be used as the second conditions, as long as Si and Cl are supplied. When a group IV n-type impurity other than Si (e.g., Ge) or a halogen element other than Cl (e.g., F) is supplied to surface layer region 114*a*, it is sufficient if a gas containing these elements is used as the introduction gas. In addition, in Embodiment 1, a quartz tray may be used instead of using silicon tray 50, and $SiCl_4$ gas may be used as the introduction gas.

Other Embodiments

A nitride-based semiconductor light-emitting element according to one or more aspects have been described so far based on the exemplary embodiments; however, the present disclosure is not limited to these embodiments. Other embodiments achieved by making various modifications to the above embodiments that are conceivable by a person of skill in the art as well as embodiments achieved by combining constituent elements of different embodiments which are within the essence of the present disclosure fall within the scope of the present disclosure.

For example, a nitride-based semiconductor forming an n-side electrode has been described with GaN as an example in the above-described aspect; however, the method of the present disclosure can also be applied when the n-side electrode is formed on AlGaN or InGaN.

The halogen element included in the surface layer region may be fluorine (F) or bromine (Br). When fluorine is employed, for example, $CF_4$ may be used as the etching gas. When bromine is employed, for example, HBr may be used as the etching gas.

Various changes, substitutions, additions, omissions, and so on, can be carried out in each of the above embodiments within the scope of the claims or its equivalents.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be used as a nitride-based semiconductor light-emitting element having stable voltage characteristics in a large-current density operation or a high-temperature operation and a manufacturing method thereof, and can be used for a laser device, an illumination device, and a display device, for example.

The invention claimed is:

1. A manufacturing method of a nitride-based semiconductor light-emitting element, the manufacturing method comprising:
   dry etching an n-type nitride-based semiconductor layer, using plasma containing a group IV n-type impurity and a halogen element; and
   forming an n-side electrode on a surface of the n-type nitride-based semiconductor layer, the surface having been exposed to the plasma in the dry etching, wherein
   a peak concentration of the group IV n-type impurity in a surface layer region of the n-type nitride-based semiconductor layer is at least $1.0 \times 10^{21}$ cm$^{-3}$, the surface layer region including the surface,
   a peak concentration of the halogen element in the surface layer region is at least 10% of the peak concentration of the group IV n-type impurity in the surface layer region, and
   in the dry etching, a Si tray is used as a supply source of the group IV n-type impurity, and $Cl_2$ gas is used as a supply source of the halogen element.

2. The manufacturing method according to claim 1, wherein
   the dry etching includes dry etching a (000-1) plane of the n-type nitride-based semiconductor layer.

3. The manufacturing method according to claim 1, wherein
   the n-type nitride-based semiconductor layer includes an n-type nitride-based semiconductor substrate,
   the manufacturing method further comprises:
   polishing the n-type nitride-based semiconductor substrate prior to the dry etching,
   the dry etching includes dry etching a polished surface of the n-type nitride-based semiconductor substrate, and
   a dislocation density of the polished surface that has been dry etched is at most $1 \times 10^9$ cm$^{-2}$.

4. A manufacturing method of a nitride-based semiconductor light-emitting element, the manufacturing method comprising:
   dry etching an n-type nitride-based semiconductor layer, using plasma containing a group IV n-type impurity and a halogen element; and
   forming an n-side electrode on a surface of the n-type nitride-based semiconductor layer, the surface having been exposed to the plasma in the dry etching, wherein
   a peak concentration of the group IV n-type impurity in a surface layer region of the n-type nitride-based semiconductor layer is at least $1.0 \times 10^{21}$ cm$^{-3}$, the surface layer region including the surface, a peak concentration of the halogen element in the surface layer region is at least 10% of the peak concentration of the group IV n-type impurity in the surface layer region, and in the dry etching, SiCl$_4$ gas is used as a supply source of the group IV n-type impurity and the halogen element.

5. The manufacturing method according to claim 4, wherein a quartz tray is used in the dry etching.

6. The manufacturing method according to claim 4, wherein the dry etching includes dry etching a (0001) plane of the n-type nitride-based semiconductor layer.

7. A manufacturing method of a nitride-based semiconductor light-emitting element, the manufacturing method comprising:

dry etching an n-type nitride-based semiconductor layer, using plasma containing a group IV n-type impurity and a halogen element; and forming an n-side electrode on a surface of the n-type nitride-based semiconductor layer, the surface having been exposed to the plasma in the dry etching, wherein the n-type nitride-based semiconductor layer includes Ga, and in an emission spectrum of the plasma at an end time of the dry etching, a peak intensity of a first emission peak resulting from Ga is lower than a peak intensity of a second emission peak resulting from the group IV n-type impurity or the halogen element.

8. The manufacturing method according to claim 7, wherein the group IV n-type impurity is Si, the halogen element is Cl, the first emission peak results from (i) a Ga atom or a Ga ion, or (ii) a molecule containing Ga or a molecule ion containing Ga, and the second emission peak results from (i) at least one of a Si atom or a Si ion or at least one of a Cl atom or a Cl ion, or (ii) a molecule containing at least one of Si or Cl or a molecule ion containing at least one of Si or Cl.

9. The manufacturing method according to claim 7, wherein the first emission peak has a center wavelength in a range from at least 294 nm to at most 295 nm, and the second emission peak has a center wavelength in a range from at least 390 nm to at most 391 nm.

* * * * *